(12) United States Patent
Lee et al.

(10) Patent No.: US 12,277,013 B2
(45) Date of Patent: Apr. 15, 2025

(54) DISPLAY PANEL AND DISPLAY DEVICE INCLUDING THE SAME

(71) Applicant: LG DISPLAY CO., LTD., Seoul (KR)

(72) Inventors: Minjic Lee, Paju-si (KR); Yeseul Han, Gimpo-si (KR); Jeongok Jo, Seoul (KR); Kwanghyun Choi, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 169 days.

(21) Appl. No.: 17/901,300

(22) Filed: Sep. 1, 2022

(65) Prior Publication Data

US 2023/0075073 A1    Mar. 9, 2023

(30) Foreign Application Priority Data

Sep. 1, 2021  (KR) .................. 10-2021-0116273

(51) Int. Cl.
*G06F 1/16* (2006.01)
*G09G 3/3266* (2016.01)
(Continued)

(52) U.S. Cl.
CPC .......... *G06F 1/1681* (2013.01); *G06F 1/1616* (2013.01); *G06F 1/1656* (2013.01);
(Continued)

(58) Field of Classification Search
CPC .... G06F 1/1681; G06F 1/1616; G06F 1/1656; G06F 1/1686; G06F 1/1688;
(Continued)

(56) References Cited

U.S. PATENT DOCUMENTS 8,736,162 B2    5/2014  Jin et al.
9,448,592 B2    9/2016  Jin et al.
(Continued)

FOREIGN PATENT DOCUMENTS

CN    102855821 A    1/2013
CN    105280099 A    1/2016
(Continued)

OTHER PUBLICATIONS

Extended European Search Report, dated Jun. 2, 2023, issued in corresponding EP Patent Application No. 22193444.1.
(Continued)

*Primary Examiner* — Abhishek M Rathod
*Assistant Examiner* — Keon Kim
(74) *Attorney, Agent, or Firm* — Morgan, Lewis & Bockius LLP

(57) ABSTRACT

The present disclosure relates to a display panel including: a first panel area having a first front face and a first rear face; a second panel area having a second front face and a second rear face, the second panel area being configured to overlap the first panel area with the second rear face facing the first rear face with the display panel in a folded state; a third panel area having a third front face and a third rear face, the third panel area being configured to overlap the second panel area with the third front face facing the second front face with the display panel in the folded state; a first hinge coupling for coupling the first panel area and the second panel area to each other; and a second hinge coupling for coupling the second panel area and the third panel area to each other.

11 Claims, 15 Drawing Sheets

(51) Int. Cl.
  *G09G 3/3275* (2016.01)
  *H05K 1/18* (2006.01)
(52) U.S. Cl.
  CPC .......... *G06F 1/1686* (2013.01); *G06F 1/1688* (2013.01); *G09G 3/3266* (2013.01); *G09G 3/3275* (2013.01); *H05K 1/189* (2013.01); *G09G 2310/0297* (2013.01); *G09G 2310/08* (2013.01)
(58) Field of Classification Search
  CPC .... G06F 1/1605; G06F 1/1624; G06F 1/1643; G06F 1/1652; G06F 1/1641; G09G 3/3266; G09G 3/3275; G09G 2310/0297; G09G 2310/08; G09G 3/3233; H05K 1/189
  See application file for complete search history.

(56) References Cited

U.S. PATENT DOCUMENTS

| | | | |
|---|---|---|---|
| 9,460,643 B2 | 10/2016 | Hirakata et al. | |
| 9,651,998 B2 | 5/2017 | Matsueda | |
| 9,905,795 B2 | 2/2018 | Matsueda | |
| 10,043,421 B2 | 8/2018 | Koo et al. | |
| 10,054,988 B2 | 8/2018 | Jin et al. | |
| 10,271,438 B2 | 4/2019 | Hirakata et al. | |
| 10,297,784 B2 | 5/2019 | Matsueda | |
| 10,528,084 B2 | 1/2020 | Jin et al. | |
| 10,573,667 B2 | 2/2020 | Ikeda et al. | |
| 10,606,318 B1 | 3/2020 | Lin | |
| 10,795,415 B2 | 10/2020 | Cavallro et al. | |
| 10,912,205 B2 | 2/2021 | Hirakata et al. | |
| 10,917,978 B2 | 2/2021 | Hirakata et al. | |
| 10,921,864 B2 | 2/2021 | Choi | |
| 10,983,562 B2 | 4/2021 | Cho et al. | |
| 10,983,564 B2 | 4/2021 | Jin et al. | |
| 11,153,980 B2 | 10/2021 | Hirakata et al. | |
| 11,304,318 B2 | 4/2022 | Hirakata et al. | |
| 11,503,723 B2 | 11/2022 | Yang et al. | |
| 11,516,927 B2 | 11/2022 | Hirakata et al. | |
| 11,552,107 B2 | 1/2023 | Ikeda et al. | |
| 11,716,820 B2 | 8/2023 | Hirakata et al. | |
| 11,723,156 B2 | 8/2023 | Yang et al. | |
| 11,822,389 B2 | 11/2023 | Jin et al. | |
| 2006/0082518 A1 | 4/2006 | Ram | |
| 2013/0271436 A1 | 10/2013 | Shiomi | |
| 2015/0212546 A1* | 7/2015 | Ram | G06F 1/162 361/679.01 |
| 2015/0262523 A1 | 9/2015 | Teranishi et al. | |
| 2016/0147362 A1 | 5/2016 | Eim et al. | |
| 2018/0174952 A1* | 6/2018 | Kim | H05K 3/244 |
| 2018/0352924 A1* | 12/2018 | Lim | H04B 1/3827 |
| 2019/0144332 A1* | 5/2019 | Kim | C03C 17/30 428/213 |
| 2020/0356145 A1* | 11/2020 | Choi | G09F 9/301 |
| 2020/0380903 A1 | 12/2020 | Dong et al. | |
| 2021/0076511 A1 | 3/2021 | Yang et al. | |
| 2021/0116964 A1* | 4/2021 | Moon | G06F 1/1643 |
| 2021/0150956 A1 | 5/2021 | Lu et al. | |
| 2023/0079181 A1 | 3/2023 | Ikeda et al. | |
| 2023/0320000 A1 | 10/2023 | Hirakata et al. | |

FOREIGN PATENT DOCUMENTS

| | | |
|---|---|---|
| CN | 110858461 A | 3/2020 |
| CN | 112562504 A | 3/2021 |
| CN | 113597592 A | 11/2021 |
| EP | 3 023 856 A1 | 5/2016 |
| JP | 2000-235354 A | 8/2000 |
| JP | 2012-22289 A | 2/2012 |
| JP | 2012022289 A * | 2/2012 |
| JP | 2016-133807 A | 7/2016 |
| JP | 2020-187353 A | 11/2020 |
| JP | 2020-190741 A | 11/2020 |
| JP | 2021-105717 A | 7/2021 |
| KR | 10-2020-0047253 A | 5/2020 |
| KR | 10-2020-0094633 A | 8/2020 |
| KR | 10-2021-0054822 A | 5/2021 |
| TW | 202127413 A | 7/2021 |
| WO | 2018/186631 A1 | 10/2018 |
| WO | 2021/080170 A1 | 4/2021 |
| WO | 2021/093048 A1 | 5/2021 |

OTHER PUBLICATIONS

Partial European Search Report dated Feb. 1, 2023, issued in counterpart European Patent Application No. 22193444.1.
Office Action issued Oct. 20, 2023 for counterpart Taiwanese Patent Application No. 111133239 (See partial English Translation) (Note: JP 2020-187353 A, WO 2018/186631 A1, JP 2012-22289 A, WO 2021/080170 A1, JP 2000-235354 A, US 2020/0380903 A1 were cited in prior IDS.).
Office Action issued Sep. 5, 2023 for counterpart Japanese Patent Application No. 2022-139292 (See English Translation) (Note: US 2020/0380903 A1, EP 3023856 A1 & US 2013/0271436 A1 were cited in prior IDS.).
Office Action issued on Sep. 3, 2024 in Chinese Patent Application No. 202211074666.2. (Note—US 2020/0356145 A1, US 2018/0352924 A1, US 2015/0212546 A1, and US 2018/0174952 A1 cited in this CN Office Action).

* cited by examiner

DISPLAY PANEL AND DISPLAY DEVICE INCLUDING THE SAME

CROSS-REFERENCE TO RELATED APPLICATION

This application claims priority from Korean Patent Application No. 10-2021-0116273 filed on Sep. 1, 2021 in the Korean Intellectual Property Office, and all the benefits accruing therefrom under 35 U.S.C. § 119. The above prior Korean application in its entirety is incorporated herein by reference.

BACKGROUND

Technical Field

The present disclosure relates to a display panel and a display device, in particular, a Z-folding display panel in which an in-folding area and an out-folding area coexist and a display device including the same.

Description of Related Art

In general, a Z-folding display device may be in a folded state via a Z-shape when being folded and may be implemented as a portable display device.

Further, the Z-folding display device has advantages of providing a display screen even in a folded state when an in-folding area and an out-folding area coexist, and of providing a wide display screen in an unfolded state.

Further, the Z-folding display device may be implemented as an organic light emitting display device that displays an image through an organic light emitting diode (hereinafter, OLED) in an active area.

In the organic light emitting display device, when a data voltage is applied to a gate of a driving thin-film transistor (TFT), a current flows between a drain and a source based on a voltage between the gate and the source and is supplied to the organic light emitting diode (OLED). Such an organic light emitting display device adjusts an amount of current flowing through the organic light emitting diode by the driving thin film transistor to display a gray level of the image.

SUMMARY

In the organic light emitting display device described above, a TFT disposed in each pixel adjusts an amount of current applied to the OLED to adjust brightness of the self-emitting OLED.

However, a display device implemented as the organic light emitting display device has a disadvantage in that an outer edge of the screen may be exposed to the exterior and thus may be vulnerable to an external impact or a scratch while being carried.

Further, in a case of a Z-folding display device implemented as a smart phone in a multi-folding scheme, the display device has a design demerit due to an increase in a thickness of the phone in a folded state.

When a thickness of a main body of the display panel is reduced to solve the issue of increased thickness, a battery capacity may be reduced. Also, it may be difficult to handle the display device with one hand as a screen size increases in an unfolded state.

Moreover, in a case of a camera, it may be difficult to reduce a thickness so that the camera may protrude outwardly from the main body and may be prone to a damage or look unsightly.

Accordingly, the inventors of the present specification have invented a display panel and a display device including the same that substantially obviate one or more problems due to the limitations and disadvantages discussed above. That is, the inventors of the present specification have invented a display panel including a first panel area, a second panel area and a third panel area being coupled to each other in a hinge coupling manner. For example, embodiments of the present disclosure may prevent the camera from protruding to the outside from a terminal of a multi-folding scheme and may protect a portion of the device vulnerable to an external impact.

Further, embodiments of the present disclosure include a display device that may include a display panel and may add an outer body external to a display unit so as to protect the folding area and the display unit. In such embodiments of the display device, a surface of the display unit may be protected by a transparent plastic material, and the outer body may serve as a handle.

The features and aspects of the present disclosure are not limited to those mentioned above. Additional features and aspects will be set forth in part in the description that follows and in part will become apparent to those skilled in the art from the description or may be learned by practice of the inventive concepts provided herein. Other features and aspects of the inventive concepts may be realized and attained by the structure particularly pointed out in, or derivable from, the written description, the claims hereof, and the appended drawings. Various embodiments of the present disclosure provide a display panel according to claim 1. Further embodiments are described in the dependent claims.

To achieve these and other advantages and in accordance with the purpose of the disclosure, as embodied and broadly described herein, a display panel may include: a first panel area having a first front face and a first rear face; a second panel area having a second front face and a second rear face, the second panel area being configured to overlap the first panel area with the second rear face facing the first rear face with the display panel in a folded state at a boundary between the first and second panel areas; a third panel area having a third front face and a third rear face, the third panel area being configured to overlap the second panel area with the third front face facing the second front face with the display panel in a folded state at a boundary between the second and third panel areas; a first hinge coupling for coupling a first end of the first panel area and a first end of the second panel area to each other in a hinge coupling manner; and a second hinge coupling for coupling a second end of the second panel area and a first end of the third panel area to each other in the hinge coupling manner, wherein the first panel area, the second panel area, and the third panel area are continuously arranged and are integrally formed with each other.

In some example embodiments, a display device may include: the above display panel; an outer body extending from a second end of the third panel area, the outer body having a width equal to a width of the third panel area and having a thickness and a vertical dimension greater than a thickness and a vertical dimension of the third panel area; and a transparent cover connected to the outer body for covering the first front face of the first panel area with the display panel in fully folded in a Z-shape.

In some example embodiments, the outer body may be configured to face and surround the first end of the first panel area, the first end of the second panel area, and the first hinge coupling with all of the first panel area, the second panel area, and the third panel area in the folded state relative to each other in the Z-shape.

In some example embodiments, the outer body may include: a cover-receiving hole formed in the outer body, the transparent cover being configured to be inserted into or slid out of the cover-receiving hole; and an accommodation space inside the outer body for accommodating the transparent cover inserted into the cover-receiving hole.

In some example embodiments, the display device may further include: a moving holder connected to the transparent cover to move the transparent cover into or out of the cover-receiving hole; and a moving rail for providing a movement path for the moving holder, wherein the moving holder and the moving rail are disposed at a lower end of the third panel area integrally formed with the outer body.

In some example embodiments, with the moving holder moving from one side to the other side along the moving rail, the transparent cover may be configured to be inserted into the cover-receiving hole and into the accommodation space of the outer body.

In some example embodiments, with the moving holder moving from the other side to the one side along the moving rail, the transparent cover may be configured to protrude out from the cover-receiving hole so as to cover the third front face of the third panel area or the first front face of the first panel area.

In some example embodiments, the outer body may have an integrated storage hole to accommodate a touch pen.

In some example embodiments, the outer body may further include: a camera for photographing an external object to obtain an image thereof; a speaker for outputting sound; a flash for outputting light; and an illuminometer for detecting ambient brightness.

In some example embodiments, the display device may further include a printed circuit board (PCB) disposed inside the outer body and electrically connected to the camera, the speaker, the flash, and the illuminometer.

In some example embodiments, the display device may further include a flexible printed circuit board (FPCB) for electrically connecting the printed circuit board (PCB) to the third panel area or a display of the third panel area.

In some example embodiments, the display panel may be connected to a printed circuit board (PCB) via a flexible printed circuit board (FPCB), the printed circuit board (PCB) having at least one contact hole via which the printed circuit board (PCB) is electrically connected to the flexible printed circuit board (FPCB).

According to another aspect of the present disclosure, a display device may include a foldable display panel including: a first panel area having a first display as a first front face thereof; a second panel area having a second display as a second front face thereof, to the second panel area being configured to overlap the first panel area in a folded state; a third panel area having a third display as a third front face thereof, the third panel area being configured to overlap the second panel area in the folded state; a first hinge coupling for coupling the first panel area and the second panel area to each other in a hinge coupling manner; and a second hinge coupling for coupling the second panel area and the third panel area to each other in the hinge coupling manner, wherein each of the first panel area, the second panel area, and the third panel area includes an active area and a non-active area, wherein the first display, the second display, and the third display are continuously arranged and are integrally formed with each other, and wherein each of the first display, the second display, and the third display includes a plurality of scan lines and a plurality of data lines arranged to intersect each other, and a plurality of pixels respectively disposed at intersections between the scan lines and the data lines, each pixel including an organic light emitting diode.

In some example embodiments, the non-active areas may include: a scan driver for applying a scan signal to the plurality of scan lines; a data driver for applying a data signal to the plurality of data lines; a power supply for providing a high-potential voltage, a low-potential voltage, and an initialization voltage to each pixel; and a timing controller for controlling the scan driver and the data driver.

In some example embodiments, the pixel may include a plurality of sub-pixels arranged in rows and columns, wherein one of the scan lines is disposed in a corresponding one of the rows of the plurality of sub-pixels, and two of the data lines are disposed in a corresponding one of the columns of the plurality of sub-pixels. The display panel may further include: a first multiplexer configured to select one of the two data lines disposed in the corresponding column; a second multiplexer configured to select the other of the two data lines disposed in the corresponding column; first and second scan switches each for switching a respective one of the scan lines disposed in each corresponding row to be connected to the one of the two data lines disposed in the corresponding column; and third and fourth scan switches each for switching a respective one of the scan lines disposed in each corresponding row to be connected to the other of the two data lines disposed in the corresponding column.

In some example embodiments, the first and second scan switches may be respectively disposed in two sub-pixels arranged consecutively in a column direction along the one of the two data lines among the plurality of sub-pixels, and the third and fourth scan switches may be respectively disposed in two sub-pixels arranged consecutively in the column direction along the other of the two data lines among the plurality of sub-pixels.

In some example embodiments, the first multiplexer may include a first multiplexer switch having: a first electrode connected to the one of the two data lines; a gate electrode connected to a first multiplexer line for applying a first selection signal; and a second electrode connected to a first power.

In some example embodiments, the first multiplexer switch may be configured to be turned on based on the first selection signal applied to the gate electrode through the first multiplexer line to apply the first power received through the second electrode to the one of the two data lines through the first electrode.

In some example embodiments, the second multiplexer may include a second multiplexer switch having: a first electrode connected to the other of the two data lines; a gate electrode connected to a second multiplexer line for applying a second selection signal; and a second electrode connected to first power.

In some example embodiments, the second multiplexer switch may be configured to be turned on based on the second selection signal applied to the gate electrode through the second multiplexer line to apply the first power received through the second electrode to the other of the two data lines through the first electrode.

According to an example embodiment of the present disclosure, the display unit may be protected by an outer body disposed outwardly of the display unit and a transparent cover extending from the outer body, and the display unit may be prevented from being damaged when being subjected to an external impact or during a movement.

Further, the present disclosure may have an advantage of increasing convenience in use as it becomes easier to handle the outer body with one hand even when a size of a display screen increases in the unfolded state.

Further, embodiments of the present disclosure may reduce a thickness of a main body of the display panel by placing a camera, pen, battery, and the like on the outer body.

Further, in the Z-folding display panel according to example embodiments of the present disclosure, data inputs of each of two pixels consecutively arranged in a column direction may be respectively connected to a data line at one side and a data line at the other side. Thus, the display panel may operate in an interlaced scheme.

Further, in the Z-folding display panel according to example embodiments of the present disclosure, when the display panel may operate in an interlaced scheme, a plurality of sub-pixels may be grouped into an odd-numbered frame group and an even-numbered frame group, and a data signal may be applied to sub-pixels corresponding to the odd-numbered frame group for a first half frame, and a data signal may be applied to sub-pixels corresponding to the even-numbered frame group for a second half frame.

Further, in the Z-folding display panel according to example embodiments of the present disclosure, when the display panel operates in a progressive scheme, the display panel may operates on a 4-scan line basis such that the data signal may be input to the first to the fourth scan lines in an order of the first line, the third line, the second line, and the fourth line.

Therefore, according to example embodiments of the present disclosure, a sensing time may increase due to a two horizontal periods (2H) operation, thereby achieving high-speed operation.

Moreover, in the Z-folding display panel according to example embodiments of the present disclosure, during a low-frequency operation for an interlaced operation, the flicker may be removed.

For example, according to the present disclosure, a thickness of a main body of the display panel that is folded in a Z-shape may be reduced, and the display panel may be handled with one hand while being unfolded. To this end, for example, an outer body is added outside of a display unit so as to protect a folding area and the display unit. For example, a surface of the display unit may be protected by transparent plastic and the outer body may serve as a handle. Therefore, the thickness of the main body of the display panel may be reduced, the display panel may be handled with one hand while being unfolded, and a portion vulnerable to impact may be protected.

Effects of the present disclosure are not limited to the above-mentioned effects, and other effects not mentioned will be clearly understood by those skilled in the art from the following descriptions.

It is to be understood that both the foregoing general description and the following detailed description of the present disclosure are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
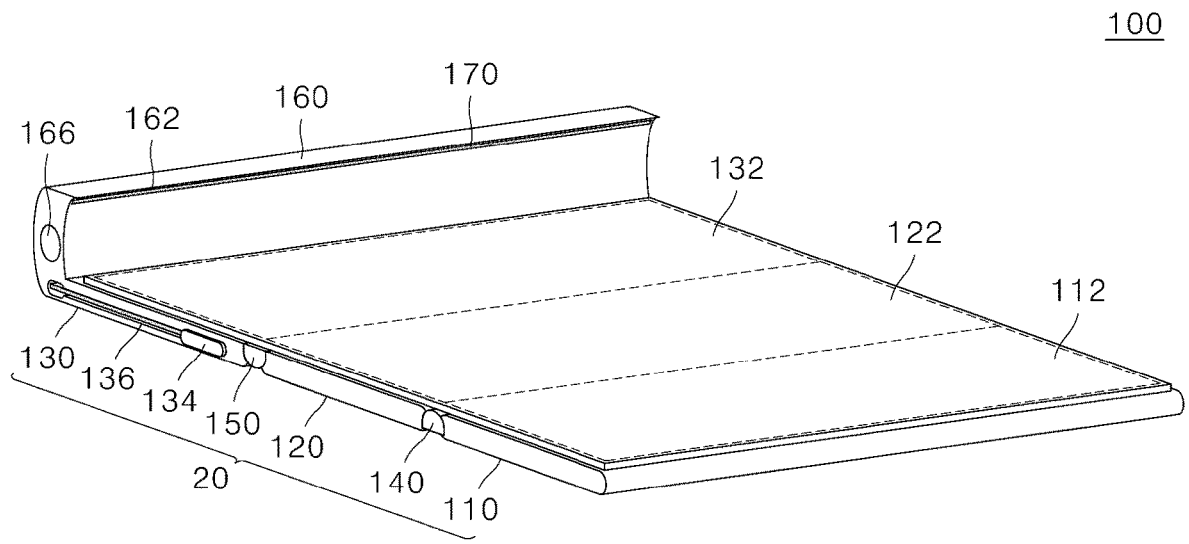
FIG. 1 is a perspective view schematically showing an external shape of a display device according to an example embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals generally denote like elements throughout the specification, unless otherwise specified.

Further, descriptions and details of well-known steps and elements may be omitted for simplicity of the description. Furthermore, in the following detailed description of the present disclosure, numerous specific details may be set forth to provide a thorough understanding of the present disclosure. However, it should be understood that the present disclosure may be practiced without these specific details. In other instances, well-known methods, procedures, components, or circuits may not be described in detail so as not to unnecessarily obscure aspects of the present disclosure.

The terminology used herein may be for the purpose of describing particular example embodiments only and is not intended to limit the present disclosure. An element described in the singular form, e.g., with a singular article "a" or "an," is intended to include a plurality of elements, and vice versa, unless the context clearly indicates otherwise.

Where the terms "comprise," "have," "include," and the like are used to specify the presence of the stated features, integers, operations, elements, and/or components, one or more other features integers, operations, elements, components, and/or portions thereof may additionally be present unless the term, such as "only," is used.

As used herein, the term "and/or" includes any and all combinations of one or more of the associated listed items. The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

In construing an element, the element is to be construed as including an error or tolerance range even where no explicit description of such an error or tolerance range is provided.

Where an element or layer is referred to as being "on" or "connected to" another element or layer, it should be understood to mean that the element or layer may be directly on or directly connected to the other element or layer, or that intervening elements or layers may be present. Also, where one element is referred to as being disposed "on" or "under" another element, it should be understood to mean that the elements may be so disposed to directly contact each other, or may be so disposed without directly contacting each other.

In describing a temporal relationship, when the temporal order of two events is described as, for example, "after," "subsequent," "next," or "before," one or more other events may occur therebetween unless a more limiting term, such as "just," "immediate(ly)," or "direct(ly)," is used.

Although the terms "first," "second," A, B, (a), (b), and the like may be used herein to describe various elements, components, regions, layers and/or sections, these elements components, regions, layers and/or sections should not be interpreted to be limited by these terms as they are not used to define a particular order or precedence. These terms are used only to distinguish one element, component, region, layer or section from another. For example, a first element could be termed a second element, and, similarly, a second element could be termed a first element, without departing from the spirit or scope of the present disclosure.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

As used herein, the terms "substantially," "about," and similar terms are used as terms of approximation, and are intended to account for inherent deviations in measured or calculated values that would be recognized by those of ordinary skill in the art. The terms may be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It should be further understood that terms, such as those defined in commonly used dictionaries, should be interpreted as having a meaning that is consistent with their meaning in the context of the relevant art and should not be interpreted in an idealized or overly formal sense unless expressly so defined herein.

In description of a signal flow relationship, for example, even when "a signal is transmitted from a node A to a node B," a signal may be transmitted from the node A to the node B via another node unless a more limiting term, such as "immediately" or "'directly," is used.

Hereinafter, an example of a display device according to example embodiments of the present disclosure will be described in detail with reference to the accompanying drawings. In allocating reference numerals to components of the drawings, the same components may have the same reference numerals across different drawings unless otherwise specified. Moreover, for convenience of illustration, a scale of each of components shown in the accompanying drawings may be different from an actual scale. Thus, the present disclosure is not limited to the scales shown in the drawings.

Hereinafter, a display panel and a display device including the same according to some embodiments of the present disclosure will be described.

Figure 2:
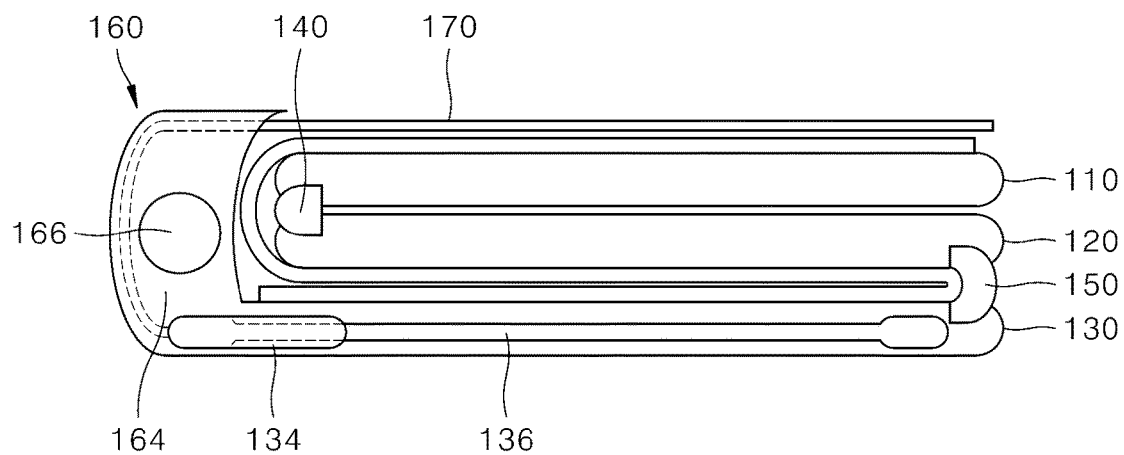
FIG. 2 is a side view showing an example in which a display face is protected by a transparent cover when a display device according to an example embodiment of the present disclosure is folded.
Figure 3:
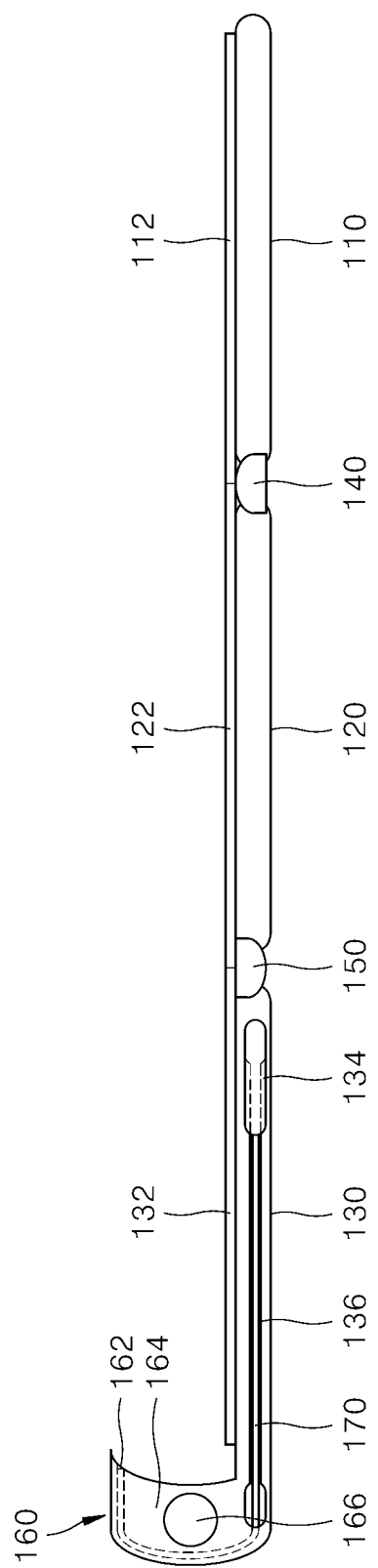
FIG. 3 is a side view of a display device according to an example embodiment of the present disclosure while unfolded.
Figure 4:
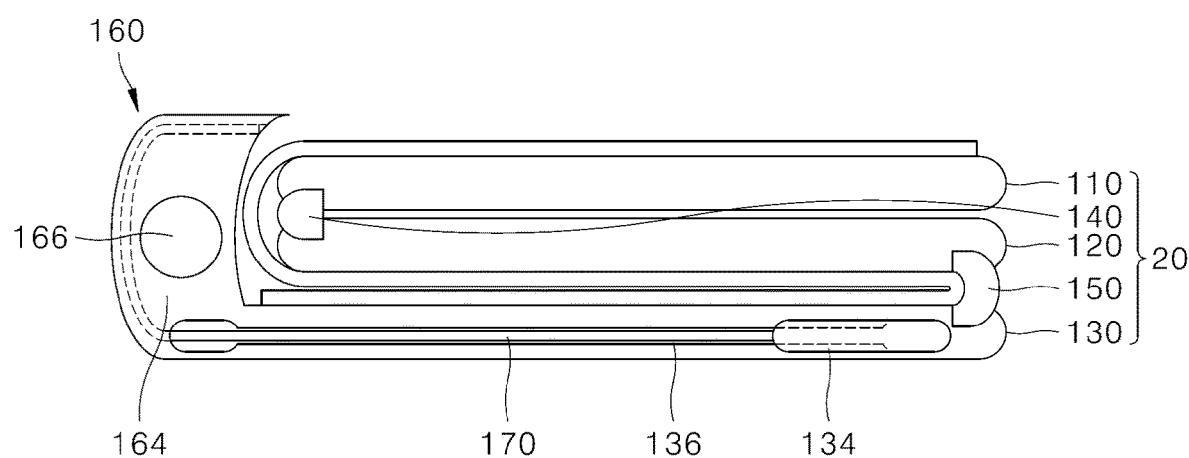
FIG. 4 is a side view showing an example in which a transparent cover is slid into a cover-receiving hole when a display device according to an example embodiment of the present disclosure is folded.
Figure 5:
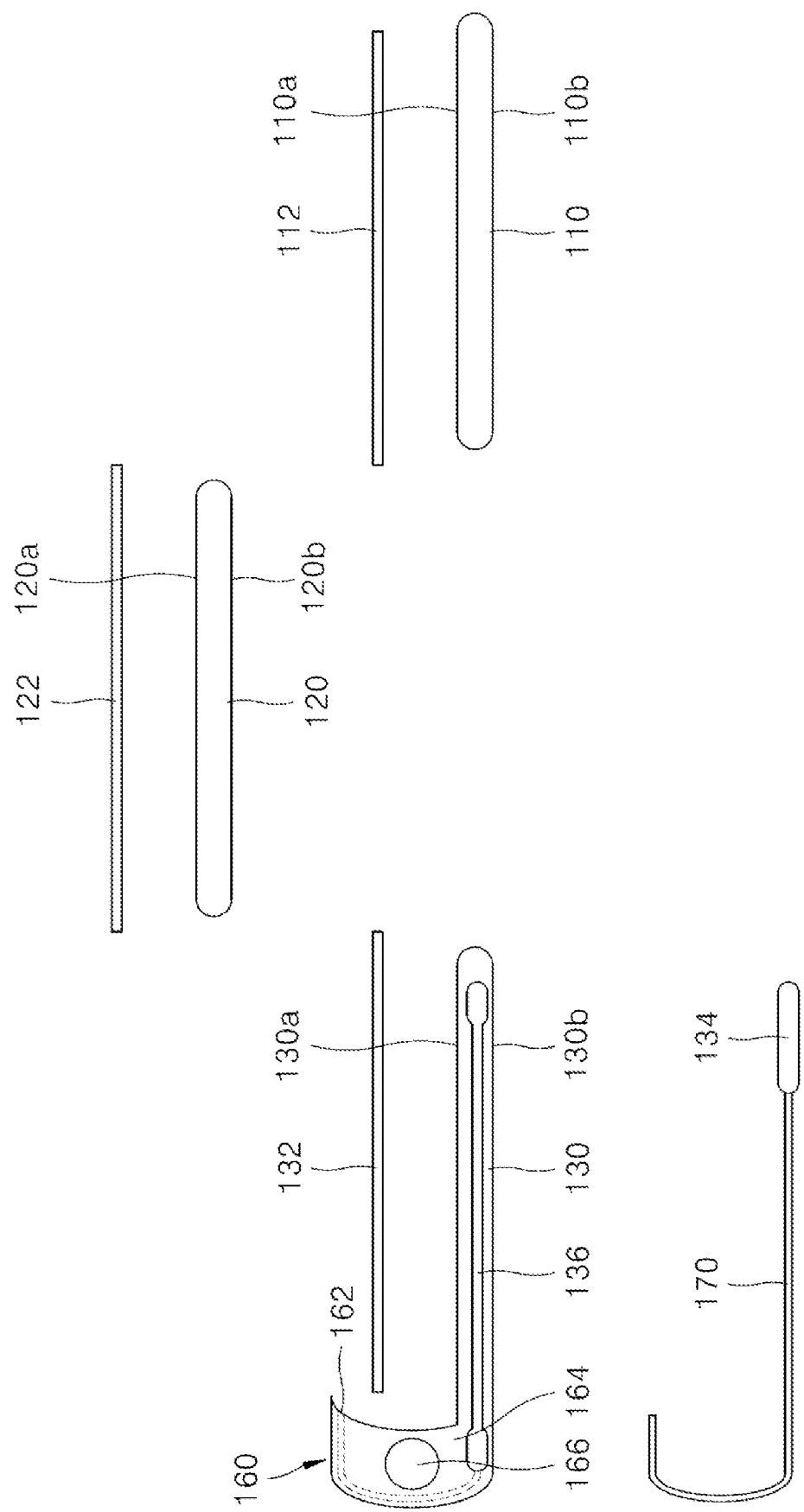
FIG. 5 shows cross-sectional views viewed from the side of disassembled first to third panel areas according to an example embodiment of the present disclosure.

FIG. 1 is a perspective view schematically showing an external shape of a display device according to an example embodiment of the present disclosure, and FIG. 2 is a side view showing an example in which a display face is protected by a transparent cover when a display device according to an example embodiment of the present disclosure is folded. FIG. 3 is a side view of a display device according to an example embodiment of the present disclosure while unfolded. FIG. 4 is a side view showing an example in which a transparent cover is slid into a cover-receiving hole when a display device according to an example embodiment of the present disclosure is folded, and FIG. 5 shows cross-sectional views viewed from the side of disassembled first to third panel areas according to an example embodiment of the present disclosure.

As shown in FIGS. 1 to 5, a display device 100 according to an example embodiment of the present disclosure may include a display panel 20 having a first panel area 110, a second panel area 120, and a third panel area 130.

The first panel area 110 may include a first front face 110a and a first rear face 110b. The first front face 110a may have the same area as or may have a smaller area than the first rear face 110b.

The first panel area 110 may include a first display unit 112 on the first front face 110a. The first display unit 112 may have the same area as or may have a smaller area than the first front face 110a.

The second panel area 120 may include a second front face 120a and a second rear face 120b. The second front face 120a may have the same area as or may have a smaller area of the second rear face 120b.

The second panel area 120 may include a second display unit 122 on the second front face 120a. The second display unit 122 may have the same area as or a smaller area than the second front face 120a.

The third panel area 130 may include a third front face 130a and a third rear face 130b. The third front face 130a may have the same area as or a smaller area than the third rear face 130b.

The third panel area 130 may include a third display unit 132 on the third front face 130a. The third display unit 132 may have the same area as or a smaller area than the third front face 130a.

Although not shown in the drawing, each of the first panel area 110, the second panel area 120, and the third panel area 130 may include an active area (AA) that is configured to display an image, and a non-active area (NA) that is configured to supply one or more signals to the active area.

The first panel area 110 may include the first display unit 112. The first panel area 110 may have the same area as the first display unit 112 or may have a larger area than the first display unit 112.

The second panel area 120 may include the second display unit 122. The second panel area 120 may have the same area as the second display unit 122 or may have a larger area than the second display unit 122.

The third panel area 120 may include the third display unit 132. The third panel area 130 may have the same area as the third display unit 132 or may have a larger area than the third display unit 132.

As the first panel area 110, the second panel area 120, and the third panel area 130 may have the same size and area as described above, internal structures thereof may be identical or similar. Accordingly, a description will be made using the third panel area 130 as an example for example embodiments in which the first panel area 110, the second panel area 120, and the third panel area 130 have the same structure. However, the present disclosure is not limited thereto.

The third panel area 130 may include a substrate therein, and a light blocking layer and a buffer layer may be disposed on the substrate. That is, the light blocking layer may be disposed on the substrate, and the buffer layer may be disposed on the light blocking layer.

The substrate may be formed with polymethylmethacrylate (PMMA), vinyl chloride, an acrylic resin, a polycarbonate (PC)-based resin, a polyethylene terephthalate (PET)-based resin, a polyethylene (PE)-based resin, a polystyrene (PS)-based resin, a polypropylene (PP)-based resin, a polyimide (PI)-based resin, a glass, a silica, and the like.

The light blocking layer may be made of a metal material having a light blocking function to block an inflow of external light. The light blocking layer may be formed in a single-layer or multi-layer structure made of one of such metals as molybdenum (Mo), aluminum (Al), chromium (Cr), tungsten (W), titanium (Ti), nickel (Ni), neodymium (Nd), and copper (Cu) or an alloy thereof.

The buffer layer may be formed on the substrate and on the light blocking layer. The buffer layer covering the light blocking layer on the substrate may be formed in a structure in which a single insulating layer or a plurality of insulating layers are stacked in order to block foreign materials including moisture, oxygen, and the like from being introduced from the substrate. The buffer layer may be formed in a single-layer or multi-layer structure of an inorganic insulating material, such as a silicon oxide (SiOx), a silicon nitride (SiNx), or an aluminum oxide (AlOx).

The third panel area 130 may have the third display unit 132 disposed on the uppermost layer.

The third display unit 130 includes a plurality of scan lines respectively disposed in rows, a plurality of data lines respectively disposed in columns and intersecting the scan lines, and a plurality of pixels respectively disposed at intersections between the scan lines and the data lines. Each pixel may include at least one sub-pixel. Accordingly, the sub-pixels may be disposed at each intersection.

For example, in the third panel area 130, the plurality of scan lines and the plurality of data lines may intersect each other on the glass substrate or the plastic substrate. sub-pixels respectively having colors of red, green, and blue may be defined at each point where a scan line and a data line intersect each other. One pixel including at least one sub-pixel may be referred to as a "unit pixel'".

In this configuration, each of the sub-pixels may include an organic light emitting diode (OLED). The plurality of scan lines may be respectively disposed in rows of the plurality of sub-pixels, and the plurality of data lines may be respectively disposed in columns of the plurality of sub-pixels. Accordingly, in the plurality of sub-pixels, the light emitting diodes (OLEDs) may be arranged in rows and columns.

In this regard, the organic light emitting diode (OLED) may be simply referred to as the "light emitting diode (OLED)," a "light emitting diode (EL)," a "'light emitting device (EL)," the "EL" or the "OLED."

Further, on the third display unit 132 of the third panel area 130, a power line formed in a direction parallel to the data line may be formed to be connected to the sub-pixels.

Further, although not shown, each sub-pixel may include at least one organic light emitting diode, a capacitor, a switching thin film transistor, and a driving thin-film transistor. The driving thin-film transistor may be referred to as a "driving transistor," a "driving switch," a "driving device," and the like.

In this regard, each organic light emitting diodes (OLEDs) may emit light with an amount of current adjusted based on a voltage between the gate and the source electrodes of the driving thin-film transistor. An anode of the organic light emitting diode (OLED) may be connected to a high-potential voltage power supply, and a cathode may be connected to a low-potential voltage power supply. An organic compound layer may be disposed between the anode and the cathode.

The organic compound layer may include a hole injection layer (HIL), a hole transport layer (HTL), an emission layer (EML), an electron transport layer (ETL), and an electron injection layer (EIL), but the present disclosure may not be limited thereto. For example, at least two organic compound layers emitting light of different colors may be stacked based on a tandem structure. When the current flows through the organic light emitting diode (OLED), holes that have passed through the hole transport layer (HTL) and electrons that have passed through the electron transport layer (ETL) may move to the emission layer (EML) to form excitons. As a result, the emission layer (EML) may emit visible light.

Further, although not shown, the driving thin-film transistor and the switching thin film transistors may be connected to a gate line (herein also referred to as scan line), a control signal supply line, and a data line. Accordingly, the current may flow through the switching thin-film transistors based on a gate voltage input to the gate line, and at the same time, the switching thin-film transistors may transfer a data voltage input to the data line to the driving thin-film transistor. The capacitor may be interposed between and connected to a thin film transistor and the power line, may be charged with the data voltage transmitted from the thin film transistor, and may keep the charges for 1 frame.

The thin film transistor may be implemented as a PMOS-type low temperature poly silicon (LTPS) TFT, thereby ensuring desired response characteristics. For example, among the thin film transistors, at least one transistor may be implemented as an NMOS-type or PMOS-type oxide TFT having good leakage current characteristics when being turned-off, and the remaining transistors may be implemented as the PMOS-type LTPS TFT having the good response characteristics.

The first panel area 110 may include the first display unit 112, the second panel area 120 may include the second display unit 122, and the third panel area 130 may include the third display unit 132. In this regard, the first display unit 112, the second display unit 122, and the third display unit 132 may all have the same structure. Detailed structures of the first display unit 112, the second display unit 122, and the third display unit 132 will be described later.

When the second panel area 120 is in a folded state at a boundary between the first and second panel areas 110 and 120, the second rear face 120b of the second panel area 120 may face the first rear face 110b of the first panel area 110 and correspond to the first panel area 110.

A first hinge coupling portion 140 may hinge-couple one end of the first panel area 110 and one end of the second panel area 120 to each other. For example, as shown in FIG. 1, a left end of the first panel area 110 may be hinge-coupled to a right end of the second panel area 120 through the first hinge coupling portion 140.

When the third panel area 130 is in the folded state at a boundary between the second and third panel areas 120 and 130, the third front face 130a of the third panel area 130 may face the second front face 120a of the second panel area 120 and correspond to the second panel area 120.

A second hinge coupling portion 150 may hinge-couple another end of the second panel area 120, which is opposite to the one end of the second panel area 120, and one end of the third panel area 130 to each other. For example, as shown in FIG. 1, a left end of the second panel area 120 may be hinge-coupled to a right end of the third panel area 130 through the second hinge coupling portion 150.

A left end of the third panel area 130 may extend with the same width as a width (that is, a dimension a direction along which the boundary between the second and third panel areas 120 and 130 extends, hereinafter referred to as "boundary extending direction") of the third panel area 130 to form an outer body 160 or may be coupled to the outer body 160. For example, the outer body 160 may be formed to extend from the left end of the third panel area 130 with the same width as the vertical width of the third panel area 130. In this regard, the outer body 160 may have a thickness (that is, a dimension in a direction in perpendicular to the boundary extending direction) and a vertical dimension (that is, a dimension in a direction in perpendicular to a display plane of the third display unit 132), each being greater than a thickness (that is, a dimension in a direction in perpendicular to a display plane of the third display unit 132) of the third panel area 130.

As shown in FIG. 1, the first panel area 110, the second panel area 120, and the third panel area 130 may be continuously arranged and may be integrally formed with each other. That is, the first display unit 112 of the first panel area 110, the second display unit 122 of the second panel area 120, and the third display unit 132 of the third panel area 130 may all be continuously arranged and may be integrally formed with each other. For example, the first display unit 112 as the first front face 110a of the first panel area 110, the second display unit 122 as the second front face 120a of the second panel area 120, and the third display unit 132 as the third front face 130a of the third panel area 130 may all be continuously arranged and may be integrally formed with each other.

The first hinge coupling portion 140 may be disposed between the first panel area 110 and the second panel area 120. Accordingly, the first panel area 110 and the second panel area 120 may be folded or unfolded by a hinge operation.

Accordingly, a boundary between the first display unit 112 and the second display unit 122 may be bent and folded or unfolded.

The second hinge coupling portion 150 may be disposed between the second panel area 120 and the third panel area 130. Accordingly, the second panel area 120 and the third panel area 130 may be folded or unfolded by the hinge operation.

Accordingly, a boundary between the second display unit 122 and the third display unit 132 may be bent and folded or unfolded.

When the first panel area 110, the second panel area 120, and the third panel area 130 are unfolded, because the first display unit 112, the second display unit 122, and the third display unit 132 are all continuously arranged and are integrally formed with each other, the first panel area 110, the second panel area 120, and the third panel area 130 may operate as one display screen.

In this regard, an image to be displayed on one display screen may be divided into three screen images, so that a first screen image may be displayed on the first display unit 112, a second screen image may be displayed on the second display unit 122, and a third screen image may be displayed on the third display unit 132.

Because the outer body 160 has the greater thickness and vertical dimension than the third panel area 130, when the first panel area 110, the second panel area 120, and the third panel area 130 are unfolded, the outer body 160 may serve as a handle.

In an example embodiment of the present disclosure, the outer body 160 is illustrated as being formed extending from the third panel area 130, but the present disclosure is not limited thereto. For example, the outer body 160 may be formed to extend from the first panel area 110 located on an opposite side of the third panel area 130.

When the first panel area 110, the second panel area 120, and the third panel area 130 are in the folded state, the outer body 160 may have a shape formed so as to surround and face the one end of the first panel area 110, the one end of the second panel area 120, and the first hinge coupling portion 140.

A cover-receiving hole 162 into which a transparent cover 170 is inserted may be formed in the outer body 160, and an accommodation space 164 for accommodating therein the transparent cover 170 inserted into the cover-receiving hole 162 may be formed inside the outer body 160.

When the first panel area 110, the second panel area 120, and the third panel area 130 are in the folded state, the third panel area 130 may be positioned as the lowermost panel area, the second panel area 120 may be located on the third panel area 130, and the first panel area 110 may be located on the second panel area 120.

When the first panel area 110, the second panel area 120, and the third panel area 130 are in the folded state, the first panel area 110 may be positioned as the uppermost panel area, and the transparent cover 170 may be located on the first panel area 110.

The transparent cover 170 may be positioned to cover the first front face 110a of the first panel area 110. That is, the transparent cover 170 may protrude from the cover-receiving hole 162 of the outer body 160 and be positioned to cover the first display unit 112 disposed on the first panel area 110.

A moving holder 134 connected to the transparent cover 170 may be disposed at a lower end of the third panel area 130 integrally formed with the outer body 160 so as to move the transparent cover 170.

Further, at the lower end of the third panel area 130, a moving rail 136 that provides a movement path of the moving holder 134 may be defined.

The moving rail 136 may be defined as long as a movement distance of the transparent cover 170 in a form of a groove into which a portion of the moving holder 134 may be inserted. That is, as the moving holder 134 and the transparent cover 170 are connected to each other, the transparent cover 170 may protrude from or be inserted into the cover-receiving hole 162 of the outer body 160 as much as the movement distance of the moving holder 134.

When the moving holder 134 moves from one side to the other side along the moving rail 136, the transparent cover 170 may be inserted into the cover-receiving hole 162 to be located in the accommodation space 164. For example, when the moving holder 134 moves from a left end to a right end along the moving rail 136 as shown in FIG. 4, the transparent cover 170 may be inserted into the cover-receiving hole 162 of the outer body 160 and be located in the accommodation space 164.

In one example, when the moving holder 134 moves from the other side to said one side along the moving rail 136, the transparent cover 170 may protrude outwardly from the cover-receiving hole 162 so as to cover the third front face 130a of the third panel area 130 (in the unfolded state). For example, when the moving holder 134 positioned as shown in FIG. 4 moves from the right end to the left end along the moving rail 136 as shown in FIG. 2, the transparent cover 170 connected to the moving holder 134 may outwardly protrude from the cover-receiving hole 162 of the outer body 160 and be positioned so as to cover the first display unit 112 of the first panel area 110.

The outer body 160 may include a storage hole 166 for storing a touch pen inserted thereinto. That is, the outer body 160 may include the storage hole 116 having a length equal to or greater than a length of the touch pen in the accommodation space 164 therein. Accordingly, a user may easily perform a touch input on the screen of the first display unit 112 in the folded state or on the screen formed by the first, second, and third display units 112, 122, and 132 in the unfolded state using the touch pen disposed in the storage hole 166 of the outer body 160.

Figure 6:
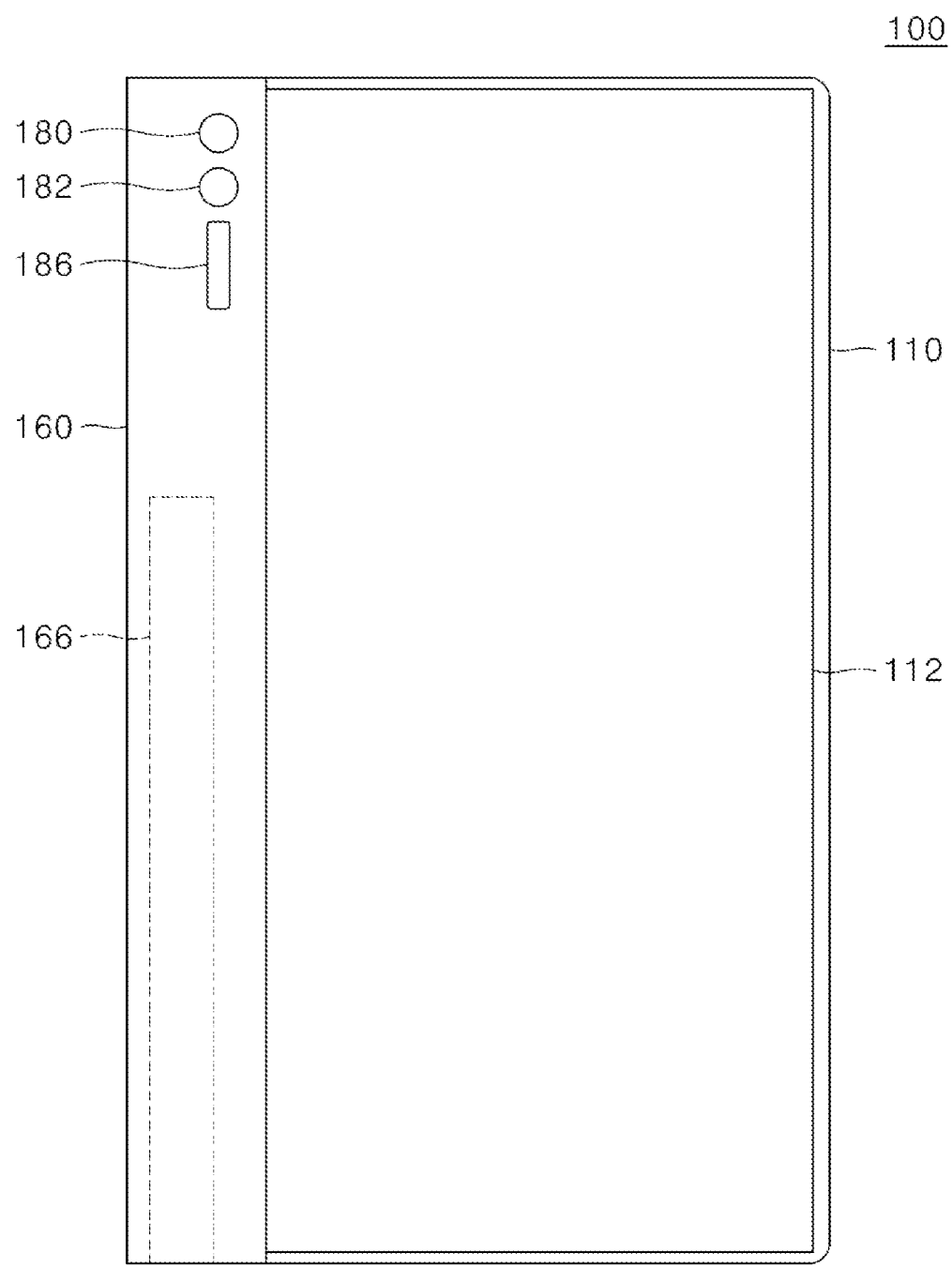
FIG. 6 is a schematic diagram showing a front face of a display device according to an example embodiment of the present disclosure when folded.
Figure 7:
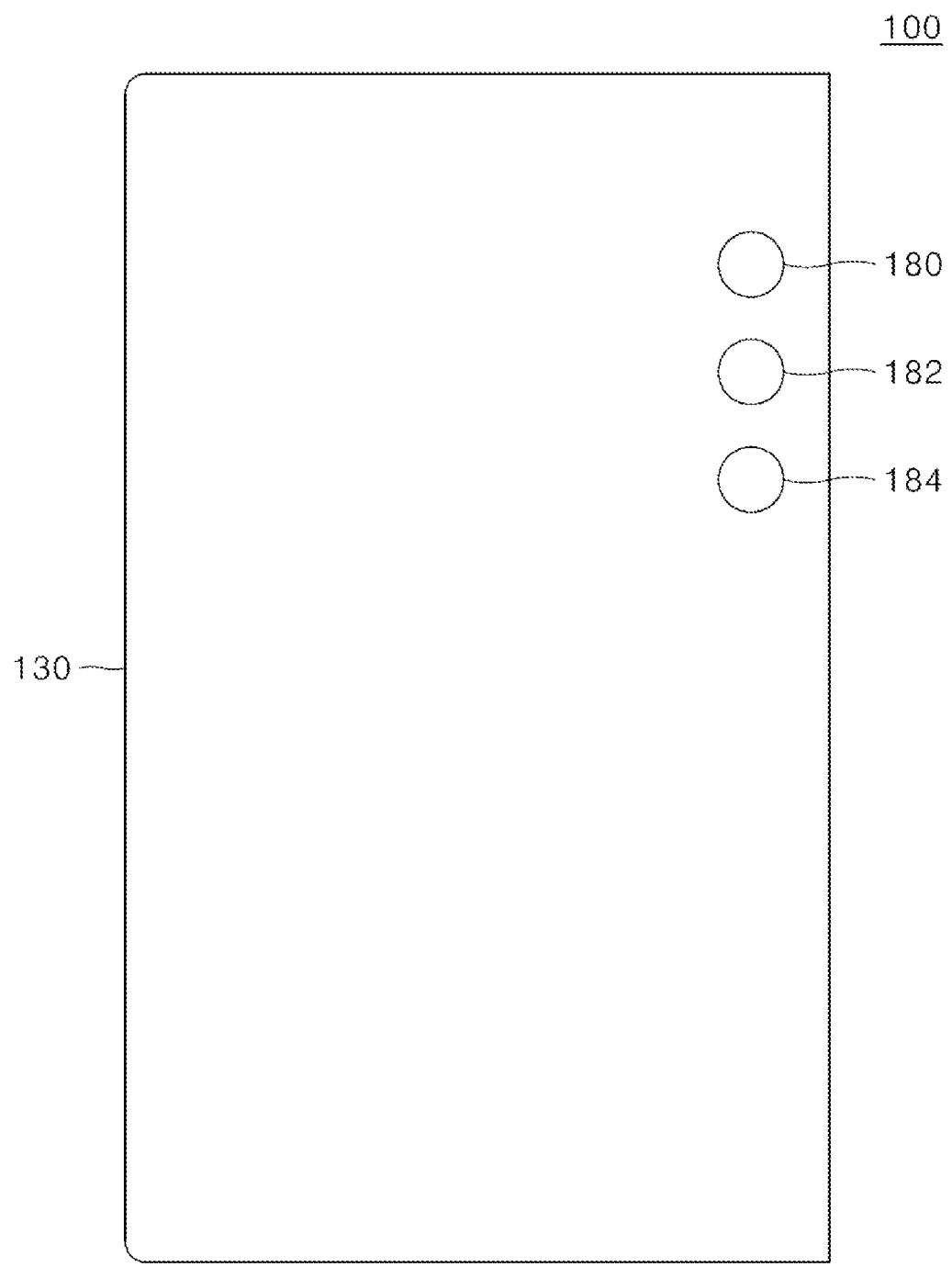
FIG. 7 is a schematic diagram showing a rear face of a display device according to an example embodiment of the present disclosure when folded.

FIG. 6 is a schematic diagram showing a front face of a display device according to an example embodiment of the present disclosure when folded, and FIG. 7 is a schematic diagram showing a rear face of a display device according to an example embodiment of the present disclosure when folded.

As shown in FIGS. 6 and 7, in the display device 100 according to an example embodiment of the present disclosure, the outer body 160 may include a camera 180, a speaker 182, a flash unit 184, and an illuminometer 186.

The camera 180 may be for obtaining an image by photographing an external object. A lens may be positioned so as to be viewed via a through-hole of the outer body 160, and an internal circuit may be disposed in the accommodation space 164 of the outer body 160.

The speaker 182 may be for outputting sound. The speaker 182 may include a cover-receiving hole for inserting a separate earphone jack therein.

The flash unit 184 may be for light output. For example, the flash unit 184 may be driven, for example, during operation of the camera 180 at night.

The illuminometer 186 may be for detecting ambient brightness. For example, the illuminometer 186 may detect the ambient brightness through an illuminance sensor, so that the illuminometer 186 may be used to automatically operate the flash unit 184 when the camera 180 is operated at night.

Figure 8:
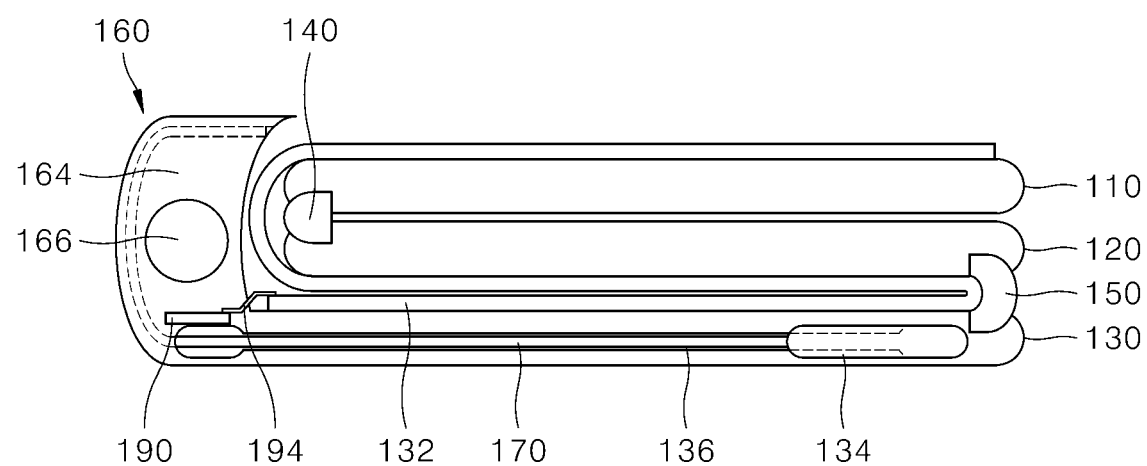
FIG. 8 is a schematic diagram showing an electrical connection relationship between a third panel area and an outer body in a display device according to an example embodiment of the present disclosure.
Figure 9:
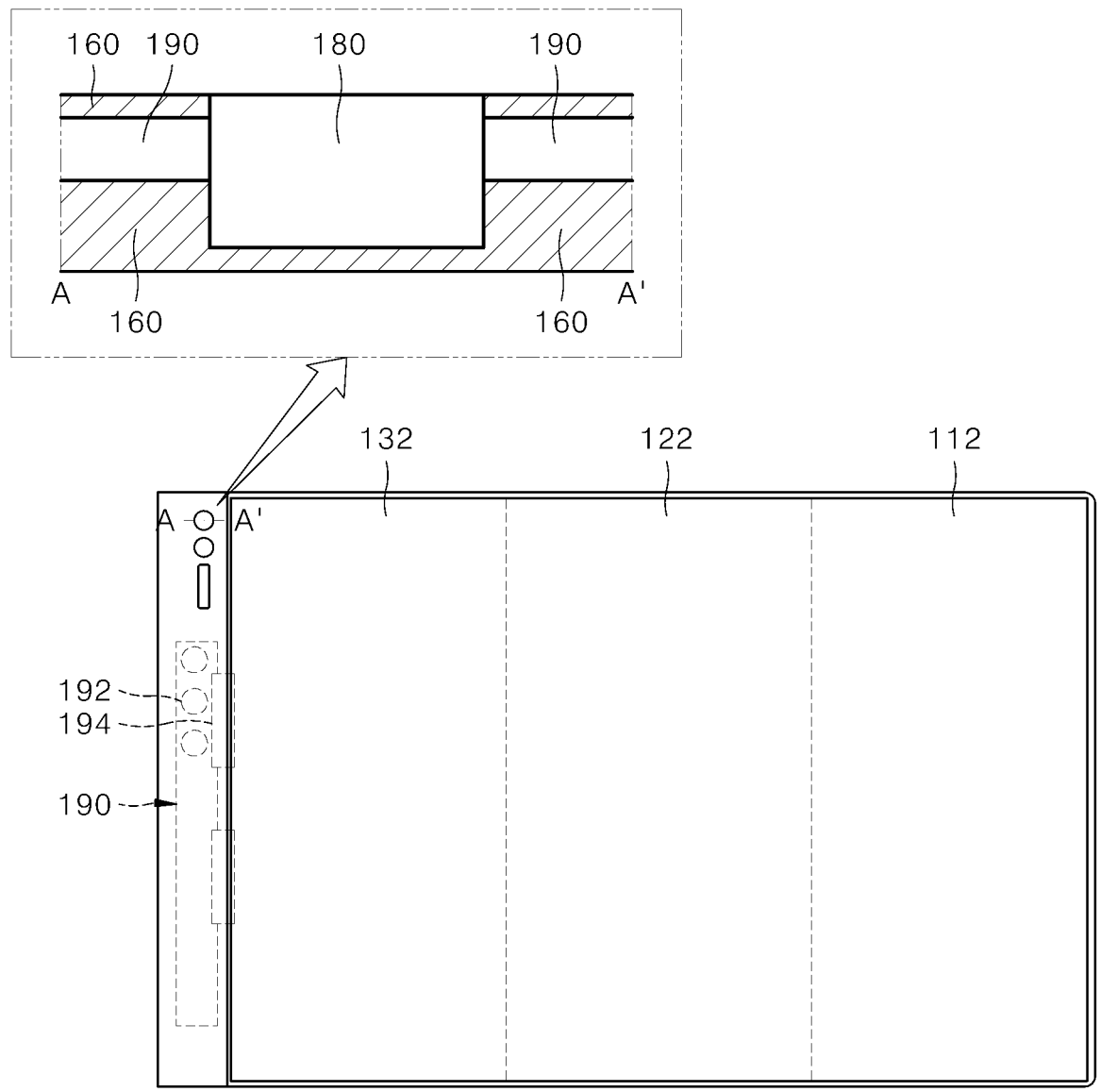
FIG. 9 is a schematic diagram showing a contact state between a third panel area and a printed circuit board of an outer body of a display device according to an example embodiment of the present disclosure.

FIG. 8 is a schematic diagram showing an electrical connection relationship between a third panel area and an outer body in a display device according to an example embodiment of the present disclosure, and FIG. 9 is a schematic diagram showing a contact state between a third panel area and a printed circuit board of an outer body of a display device according to an example embodiment of the present disclosure.

As shown in FIGS. 8 and 9, the outer body 160 of the display device 100 according to an example embodiment of the present disclosure may include a printed circuit board (PCB) 190 in the accommodation space 164.

The printed circuit board 190 may be disposed inside the outer body 160, and may be electrically connected to the camera 180, the speaker 182, the flash unit 184, and the illuminometer 186.

The printed circuit board 190 may be electrically connected to the third display unit 132 of the third panel area 130 through one or more flexible printed circuit boards (FPCB) 194.

The printed circuit board (PCB) 190 may have at least one contact hole 192 formed therein. The printed circuit board (PCB) 190 may be electrically connected to the flexible printed circuit board (FPCB) 194 via the at least one contact hole 192.

The flexible printed circuit board (FPCB) 194 may connect the printed circuit board (PCB) 190 and the third panel area 130 to each other or electrically connect the printed circuit board (PCB) 190 and the third display unit 132 of the third panel area 130 to each other.

The flexible printed circuit board 194 may have one side electrically in contact with the third display unit 132 of the third panel area 130, and the other side electrically in contact with the printed circuit board (PCB) 190 via the at least one contact hole 192.

The printed circuit board (PCB) 190 may have a through-hole defined therein in which the camera 180 extends. A through-hole through which the camera 180 is visually recognized may also be defined in an outer face of the outer body 160. Therefore, the camera 180 may be located in the accommodation space 164 inside the outer body 160, may extend through the printed circuit board (PCB) 190 via the through-hole, and may be visually recognized from the outside via the through-hole of the outer face of the outer body 160.

Figure 10:
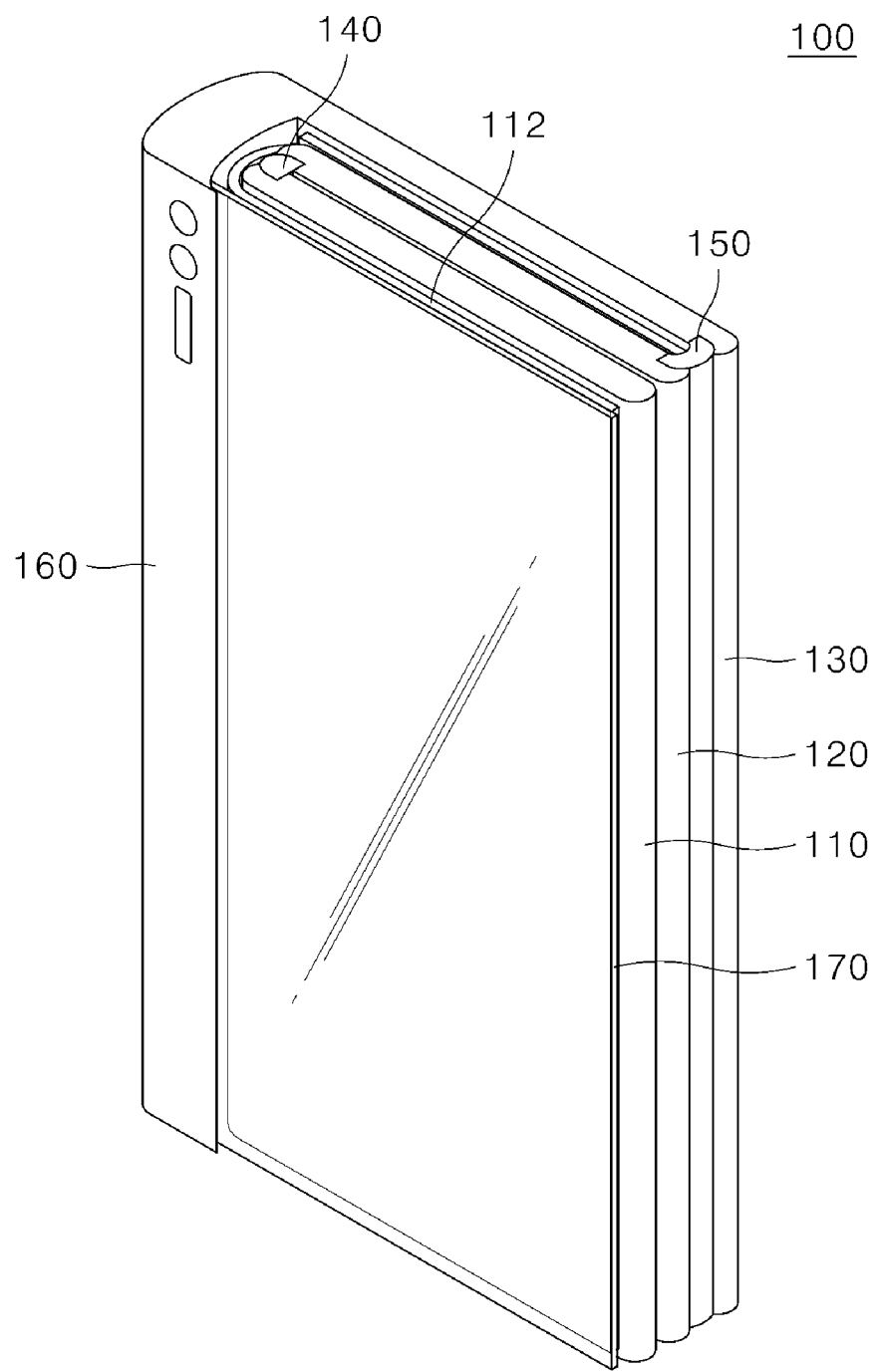
FIG. 10 is a diagram showing an example of displaying an image when a display device according to an example embodiment of the present disclosure is in a folded state.
Figure 11:
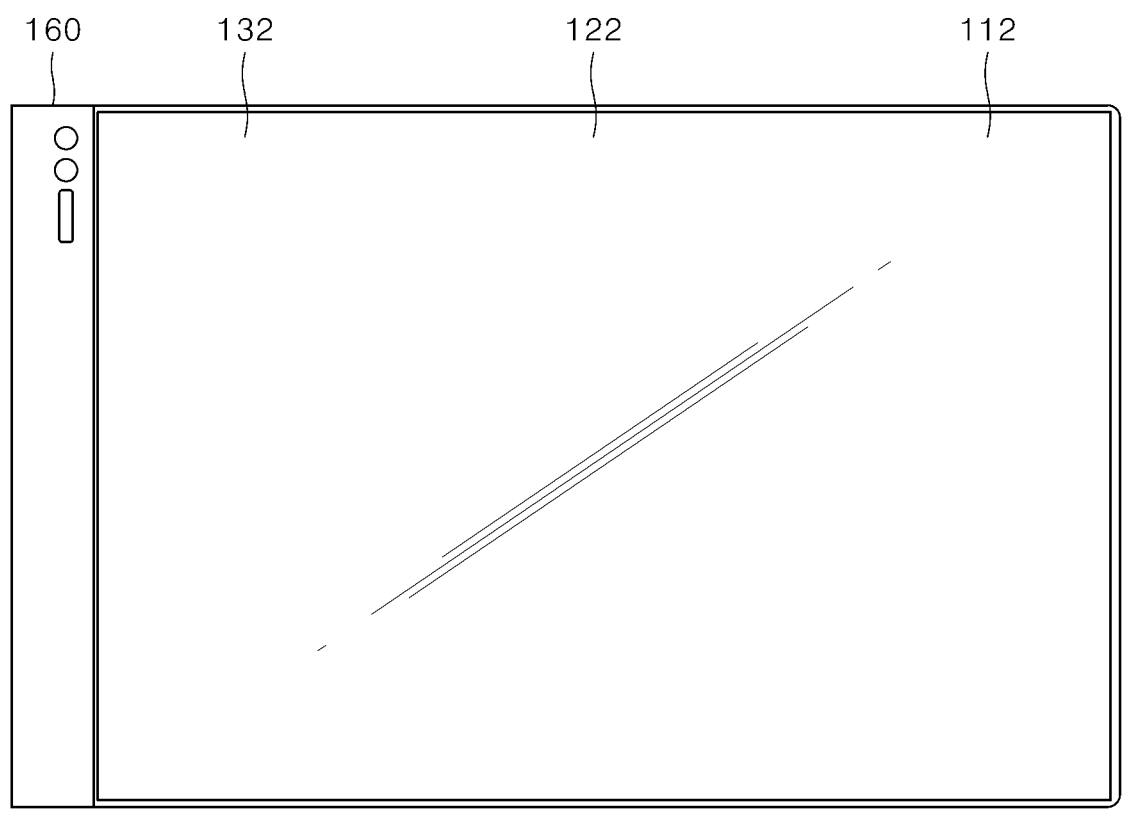
FIG. 11 is a diagram showing an example of displaying an image when a display device according to an example embodiment of the present disclosure is in an unfolded state.

FIG. 10 is a diagram showing an example of displaying an image when a display device according to an example embodiment of the present disclosure is in a folded state, and FIG. 11 is a diagram showing an example of displaying an image when a display device according to an example embodiment of the present disclosure is in an unfolded state.

As shown in FIG. 10, in the display device 100 according to an example embodiment of the present disclosure, when the first panel area 110, the second panel area 120, and the third panel area 130 are in the folded state, the first panel area 110 may be located at the top.

In this regard, the display device 100 may have the outer body 160 positioned on the left end thereof, and the first panel area 110 positioned on the right end.

Accordingly, the first panel area 110 may display the image through the first display unit 112.

In this regard, the image displayed on the first display unit 112 may be one image having an area corresponding to an area of the first display unit 112 based on horizontal and vertical dimensions. That is, said one image may be the one screen image that is not divided into the three screen images.

As shown in FIG. 11, in the example display device 100, when the first panel area 110, the second panel area 120, and the third panel area 130 are in the unfolded state, the first display unit 112, the second display unit 122, and the third display unit 132 may form one display screen that is continuously and integrally formed.

In this regard, said one display screen may be a screen having an area that is a sum of a first area based on lateral and longitudinal dimensions of the first display unit 112, a second area based on lateral and longitudinal dimensions of the second display unit 122, and a third area based on lateral and longitudinal dimensions of the third display unit 132.

In this regard, the images displayed through the first display unit 112, the second display unit 122, and the third display unit 132 may be divided images divided into a first image corresponding to the first area, a second image corresponding to the second area, and a third image corresponding to the third area, respectively.

Accordingly, the display device 100 may display said one image as the first image is output from the first display unit 112, the second image is output from the second display unit 122, and the third image is output from the third display unit 132.

Figure 12:
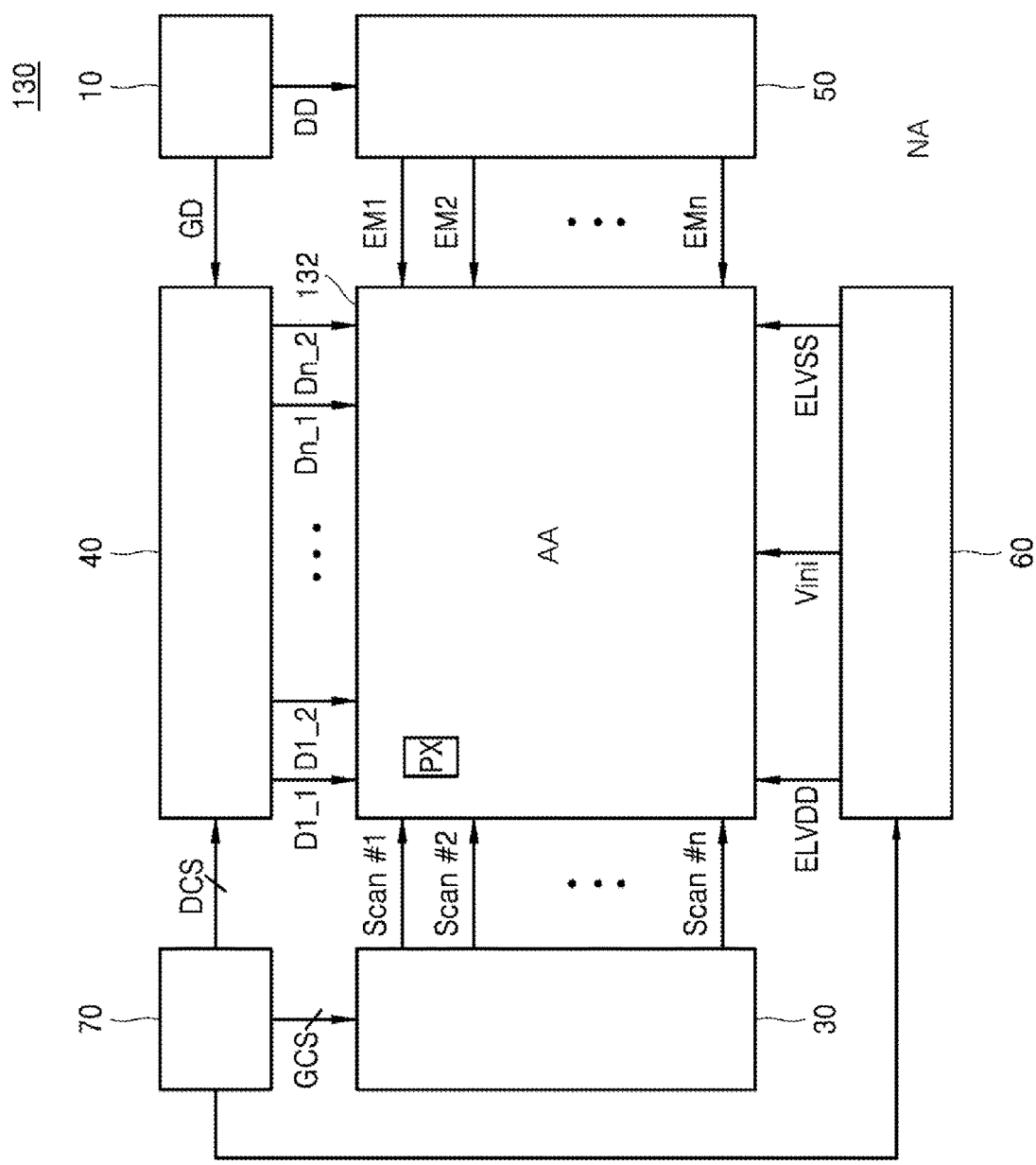
FIG. 12 is a block diagram schematically showing a configuration of a third panel area in a display device according to an example embodiment of the present disclosure.
Figure 13:
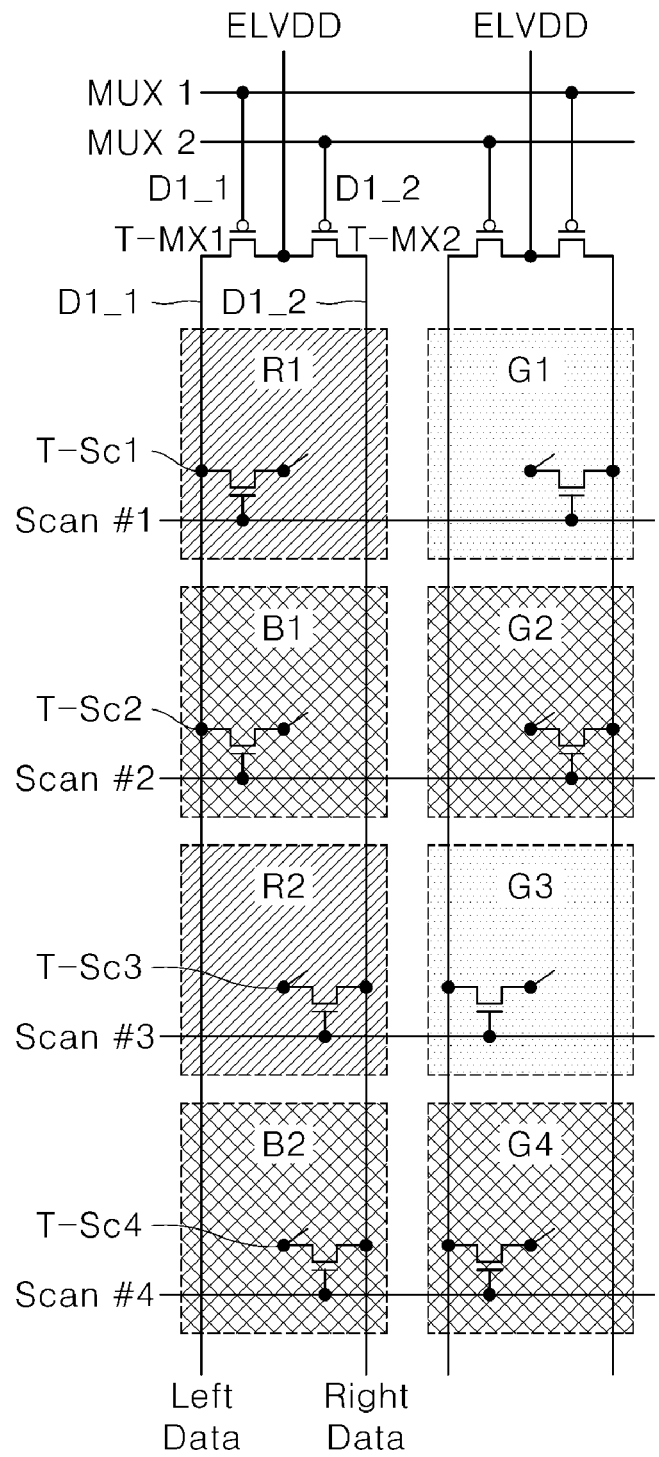
FIG. 13 is a block diagram schematically showing an example pixel configuration.

FIG. 12 is a block diagram schematically showing a configuration of a third panel area in a display device according to an example embodiment of the present disclosure, and FIG. 13 is a block diagram schematically showing an example pixel configuration.

As shown in FIG. 12, the third panel area 130 according to an embodiment of the present disclosure may include an active area AA and a non-active area NA other than the active area.

In this regard, the first panel area 110 and the second panel area 120 may also have the same structure as the third panel area 130, and components of the third panel area 130 described below may be equally applicable to the first panel area 110 and the second panel area 120.

The active area AA may include the third display unit 132 including a plurality of sub-pixels (PXs) arranged in rows and columns. Therefore, an active area of the first panel area 110 may include the first display unit 112, and an active area of the second panel area 120 may include the second display unit 122.

In the third display unit 132, a plurality of scan lines Scan #1 to Scan #n and a plurality of data lines D1_1, D1_2 to Dn_1, and Dn_2 may intersect each other. Each sub-pixel PX may be defined at a corresponding intersection therebetween. In this example configuration, each sub-pixel PX may include the organic light emitting diode (OLED).

For example, the third display unit 132 may include a glass substrate or a plastic substrate, the plurality of scan lines Scan #1 to Scan #n and the plurality of data lines D1_1, D1_2 to Dn_1, Dn_2 disposed on the glass substrate or the plastic substrate, and intersecting each other, and sub-pixels R, G, and B corresponding to red, green, and blue, respectively, and respectively defined at the intersections between the scan lines Scan #1 to Scan #n and the data lines D1_1, D1_2 to Dn_1, Dn_2.

The plurality of scan lines Scan #1 to Scan #n may be arranged such that one scan line is disposed in each row composed of the plurality of sub-pixels, as shown in FIG. 13.

The plurality of data lines D1_1, D1_2 to Dn_1, and Dn_2 may be arranged such that two data lines are disposed in each column composed of the plurality of sub-pixels, as shown in FIG. 13.

Each of the scan lines may be connected to a scan driver 30 and each of the data lines to a data driver 40. Further, in the third display unit 132, power supply voltage supply lines ELVDD, Vini, and ELVSS may be further formed in a direction parallel to the data lines D1_1, D1_2 to Dn_1, and Dn_2 and be connected to each sub-pixel.

A given pixel may include at least one of a first sub-pixel (for example, red subpixel R1, R2), a second sub-pixel (for example, green subpixel G1, G2) and a third sub-pixel (for example, blue subpixel B1, B2) as shown in FIG. 13. One pixel may include two second sub-pixel G1 and G2, as show in FIG. 13.

In the third display unit 132, one scan line Scan #1 may be disposed in each row, and two data lines may be disposed in each column. For example, a data line D1_1 may be disposed at one side (Left) of the column, and a data line D1_2 may be disposed at the other side (Right) of the column. That is, in one sub-pixel R1, one scan line Scan #1 and two data lines D1_1 and D1_2 may be disposed.

The third display unit 132 may include a first multiplexer MUX 1 that is configured to select the data line D1_1 of one side (Left) among the two data lines disposed in each column, and a second multiplexer MUX 2 that is configured to select the data line D1_2 of the other side (Right) among the two data lines disposed in each column.

The third display unit 132 may include a first scan switch T-Sc_1 for switching the scan line Scan #1 disposed in a first row to be connected to the data line D1_1 of one side (Left) disposed in each column, a second scan switch T-Sc2 for switching the scan line Scan #2 disposed in a second row to be connected to the data line D1_1 of one side (Left) disposed in each column, a third scan switch T-Sc3 for switching the scan line Scan #3 disposed in a third row to be connected to the data line D1_2 of the other side (Right) disposed in each column, and a fourth scan switch T-Sc4 for switching the scan line Scan #4 disposed in a fourth row to be connected to the data line D1_2 of the other side (Right) disposed in each column. In this regard, each of the first scan switch T-Sc1 to the fourth scan switch T-Sc4 may be implemented as, for example, a thin-film transistor (TFT).

The first and second scan switches T-Sc_1 and T-Sc2 may be respectively disposed in two sub-pixels consecutively arranged in a column direction along the data line D1_1 at one side (Left) among a plurality of sub-pixels, for example, a first red sub-pixel R1 and a first blue sub-pixel B1. In this regard, the two sub-pixels consecutively arranged in the column direction along the data line D1_1 of one side (Left) may be sub-pixels R1 and B1 of different colors, or sub-pixels G3 and G4 of the same color.

The third and fourth scan switches T-Sc3 and T-Sc4 may be respectively disposed in two sub-pixels consecutively arranged in the column direction along the data line D1_2 of the other side (Right) among the plurality of sub-pixels, for example, a second red sub-pixel R2 and a second blue sub-pixel B2. In this regard, the two sub-pixels consecutively arranged in the column direction along the data line D1_2 of the other side (Right) may be sub-pixels R2 and B2 of different colors, or sub-pixels G1 and G2 of the same color.

The first and second scan switches T-Sc1 and T-Sc2 and the third and fourth scan switches T-Sc3 and T-Sc4 may be arranged along the plurality of sub-pixels arranged in the column direction such that the first and second scan switches T-Sc1 and T-Sc2 may be disposed at a left side and the third and fourth scan switches T-Sc3 and T-Sc4 may be disposed at a right side.

The first multiplexer MUX 1 may include a first multiplexer switch T-MX1 having a first electrode connected to the data line D1_1 of one side (Left), a gate electrode connected to a first multiplexer line MUX1 for applying a first selection signal, and a second electrode connected to first power ELVDD.

The first multiplexer switch T-MX1 may be turned on as the first selection signal is applied to the gate electrode through the first multiplexer line MUX1. Thus, the first power ELVDD applied through the second electrode of the first multiplexer switch T-MX1 may be applied to the data line D1_1 of one side (Left) through the first electrode.

The second multiplexer MUX 2 may include a second multiplexer switch T-MX2 having a first electrode connected to the data line D1_2 of the other side (Right), a gate electrode connected to a second multiplexer line MUX2 for applying a second selection signal, and a second electrode connected to the first power ELVDD.

The second multiplexer switch T-MX2 may be turned on as the second selection signal is applied to the gate electrode through the second multiplexer line MUX2. Thus, the first power ELVDD applied through the second electrode may be applied to the data line D1_2 of the other side (Right) through the first electrode.

Further, each sub-pixel may include at least one organic electroluminescent diode OLED, a capacitor Cst, switching thin-film transistors T1 and T2 and a driving thin-film transistor Tdr. In this regard, the organic electroluminescent diode OLED may include a first electrode (hole injection electrode), an organic compound layer, and a second electrode (electron injection electrode).

The organic compound layer may include a light-emitting layer for emitting light and may further include various organic layers for efficiently transferring carriers including holes or electrons to the light-emitting layer. These organic layers may include a hole injection layer and a hole transport layer positioned between the first electrode and the light-emitting layer, and an electron injection layer and an electron transport layer positioned between the second electrode and the light-emitting layer.

The non-active area NA may be located inside the rear face of the third display unit 132, and may include a luminance controller 10, the scan driver 30, the data driver 40, a light-emission controller 50, a power supply 60, and a timing controller 70.

The luminance controller 10 may provide one gamma set selected from among a plurality of gamma sets each including a plurality of gamma data to the data driver 40 and may provide dimming data corresponding to the selected gamma set to the light-emission controller 50.

The scan driver 30 may apply a scan signal to the plurality of scan lines Scan #1 to Scan #n. For example, the scan driver 30 may sequentially apply a gate voltage to the sub-pixel on one horizontal line basis in response to a gate control signal GCS input thereto. The scan driver 30 may be implemented as a shift register having multiple stages that sequentially output a high-level gate voltage every one horizontal period H.

The data driver 40 may apply a data signal to the plurality of data lines D1_1, D1_2 to Dn_1, and Dn_2. For example, the data driver 40 may receive an image signal of a digital waveform applied from the timing controller 70, convert the image signal into a data voltage as an analog voltage having a gray level value that each sub-pixel may process, and then supply the data voltage to each sub-pixel through the data lines D1_1, D1_2 to Dn_1, Dn_2 in response to a data control signal DCS input thereto. In this regard, the data driver 40 may convert the image signal into the data voltage based on multiple reference voltages supplied from a reference voltage supplier (not shown).

Further, the data driver 40 may apply low-potential voltage ELVSS and initialization voltage Vini in a 30 Hz operation mode and low-potential voltage ELVSS and initialization voltage Vini in a 60 Hz operation mode to the third display unit 132 such that the low-potential voltage ELVSS and initialization voltage Vini in a 30 Hz operation mode are different from low-potential voltage ELVSS and initialization voltage Vini in a 60 Hz operation mode. For example, the data driver 40 may provide the low-potential voltage ELVSS and the initialization voltage Vini having the same value to the third display unit 132 in the 30 Hz operation mode. However, in the 60 Hz operation mode, the data driver 40 may provide the third display unit 132 with the low-potential voltage ELVSS and the initialization voltage Vini different from the low-potential voltage ELVSS and the initialization voltage Vini in the 30 Hz operation mode. For example, in the 60 Hz operation mode, the data driver 40 may provide the third display unit 132 with the low-potential voltage ELVSS and the initialization voltage Vini such that a difference between the low-potential voltage ELVSS and the initialization voltage Vini is greater than or equal to a predefined reference.

Further, when the data driver 40 receives one selected gamma set from the luminance controller 10, the data driver may provide the low-potential voltage ELVSS and the initialization voltage Vini corresponding to said one selected gamma set based on a look-up table to the third display unit 132.

The light-emission controller 50 may apply light-emission control signals EM 1 to EM n to the plurality of sub-pixels.

The power supply 60 may provide high-potential voltage ELVDD, low-potential voltage ELVSS, and initialization voltage Vini to each sub-pixel.

The timing controller 70 may control the scan driver 30 and the data driver 40. For example, the timing controller 70 may receive an image signal, a clock signal, and timing signals, such as vertical and horizontal synchronization signals, from an external system, may generate the gate control signal GCS and the data control signal DCS based on the received signals, and may provide the gate control signal GCS and the data control signal DCS respectively to the scan driver 30 and the data driver 40.

In this regard, the horizontal synchronization signal may indicate a time it takes to display one line of a display screen, and the vertical synchronization signal may indicate a time it takes to display a display screen of one frame. Further, the clock signal may refer to a signal based on which control signals of each of the drivers (e.g., the scan driver 30 and the data driver 40) are generated.

In one example, the timing controller 70 may be connected to an external system through a predetermined interface and may receive an image-related signal and a timing signal output therefrom at high speed without noise. The interface may include a LVDS (Low Voltage Differential Signal) scheme interface or a TTL (Transistor-Transistor Logic) scheme interface.

Figure 14:
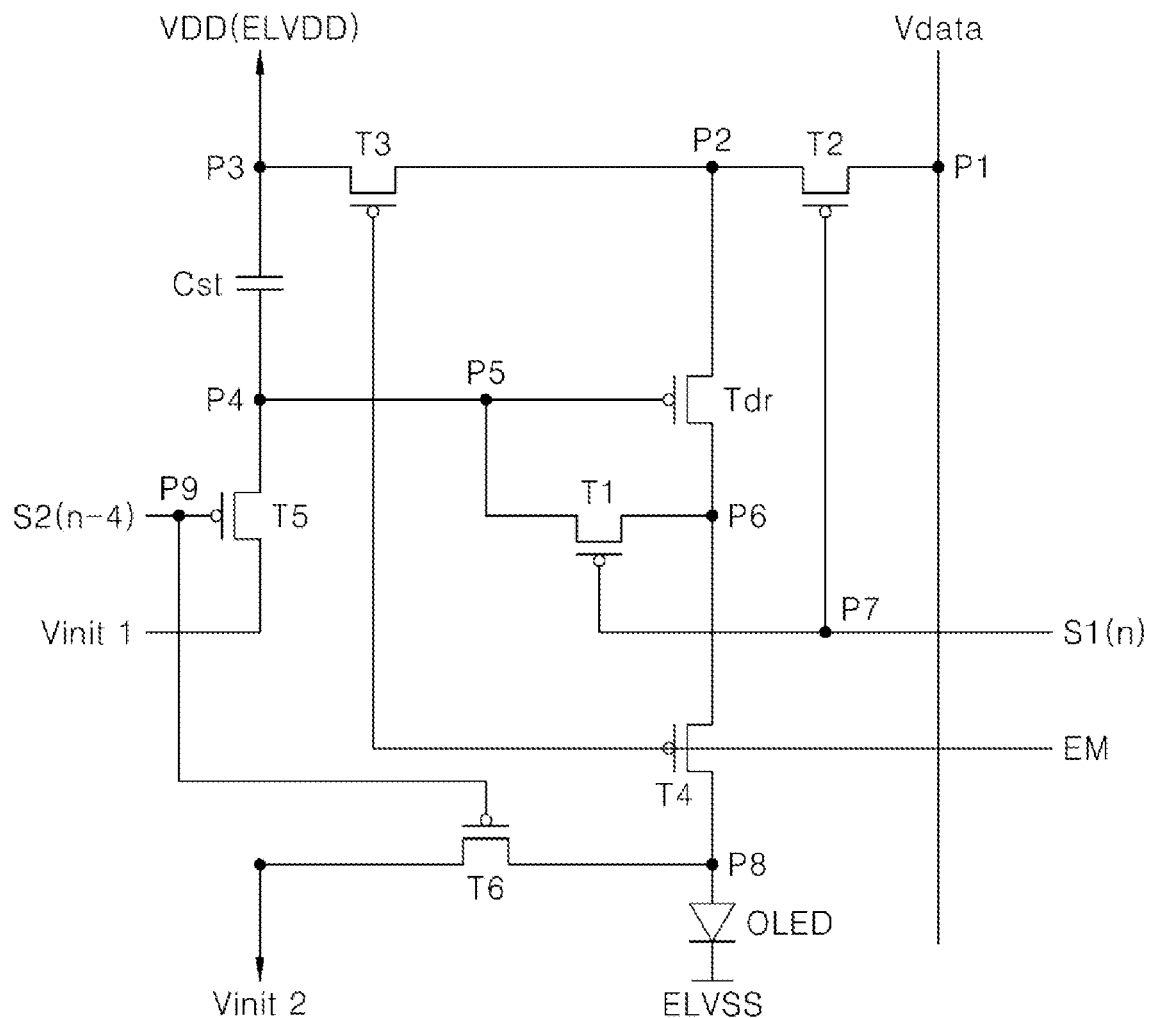
FIG. 14 is a circuit diagram showing an example circuit configuration of one sub-pixel in a third panel area according to an example embodiment of the present disclosure.

FIG. 14 is a circuit diagram showing an example circuit configuration of one sub-pixel in a third panel area according to an example embodiment of the present disclosure.

As shown in FIG. 14, in the third display unit 132 of the third panel area 130 according to an example embodiment of the present disclosure, one sub-pixel (e.g., each sub-pixel) may include a plurality of thin-film transistors T1 to T6, an organic electroluminescent diode OLED, a driving thin-film transistor Tdr, and an internal compensation circuit.

In this regard, the organic electroluminescent diode (OLED) may be simply referred to as 'light-emitting diode (OLED)', 'light-emitting diode (EL)', 'light-emitting element (EL)', 'EL' or 'OLED'. Further, the driving thin-film transistor Tdr may be referred to as 'driving transistor Tdr' or 'driving switch Tdr'.

At least one (e.g., all) of the thin-film transistors T1 to T6 and Tdr included in the sub-pixel PX may be implemented as PMOS-type LTPS (Low Temperature Poly Silicon) TFT. Thus, desired response characteristics may be secured. For example, at least one transistor among the thin-film transistors T1 to T6 may be implemented as an NMOS type or PMOS type oxide TFT with good leakage current characteristics when being turned off, while each of the remaining transistors may be implemented as a PMOS type LTPS TFT with good response characteristics. However, the present disclosure is not limited thereto The OLED may emit light based on an amount of current adjusted based on a gate-source voltage Vgs of the driving thin-film transistor Tdr. An anode electrode of the OLED may be connected to a node P8, and a cathode electrode of the OLED may be connected to low-potential power voltage ELVSS. An organic compound layer may be formed between the anode electrode and the cathode electrode.

The organic compound layer may include a hole injection layer (HIL), a hole transport layer (HTL), a layer emission layer (EML), an electron transport layer (ETL), and an electron injection layer (EIL). However, the present disclosure is not limited thereto. For example, two or more organic compound layers emitting different colors may be stacked according to a tandem structure. When a current flows through the light-emitting diode (OLED), holes passing through the hole transport layer (HTL) and electrons passing through the electron transport layer (ETL) may move to the light-emitting layer (EML) and may be combined with each other therein to form excitons. As a result, the light-emitting layer (EML) may emit visible light.

The driving thin-film transistor Tdr is a driving element that may control current flowing through the (OLED) based on the gate-source voltage Vgs thereof. The driving thin-DB1/film transistor Tdr may have a gate electrode connected to a node P5, one of first and second electrodes connected to a node P2 and the other thereof connected to a node P6. The gate-source voltage Vgs of the driving transistor Tdr may refer to a voltage across the node P5 and the node P6.

Further, the first thin-film transistor T1 operating based on an n-th first scan signal S1($n$) may be connected to and disposed between the node P5 and the node P6. That is, the first thin-film transistor T1 may be configured to have one of its first and second electrodes connected to the node P5, the other connected to the node P6, and its gate electrode connected to a line for receiving the n-th first scan signal S1($n$) (at P7).

Further, the second thin-film transistor T2 connected to a data line Vdata may be connected to the node P2. That is, the second thin-film transistor T2 may be configured to have one of its first and second electrodes connected to the data line Vdata (at P1), the other connected to the node P2, and its gate electrode connected to a line for receiving the n-th first scan signal S1($n$) (at P7).

Accordingly, the first thin-film transistor T1 and the second thin-film transistor T2 may be turned on based on the n-th first scan signal S1($n$).

Further, the gate electrode of the driving transistor Tdr may be connected to a first electrode of the storage capacitor Cst. A second electrode of the storage capacitor Cst may be connected to first power, that is, high-potential power VDD (e.g., ELVDD).

Further, the third thin-film transistor T3 may be connected to and disposed between the first electrode of the driving transistor Tdr and the second electrode of the storage capacitor Cst. That is, the third thin-film transistor T3 may be configured to have one of its first electrode and second electrode connected to the node P2, the other connected to the node P3, and its gate electrode connected to a line for receiving a light-emission control signal EM.

Further, the fourth thin-film transistor T4 may be connected to and disposed between the second electrode of the driving transistor Tdr and the anode electrode of the OLED. That is, the fourth thin-film transistor T4 may be configured such that one of its first electrode and second electrode is connected to the node P6, the other is connected to the node P8, and its gate electrode is connected to a line for receiving the light-emission control signal EM.

Accordingly, the third thin-film transistor T3 and the fourth thin-film transistor T4 may be turned on based on the light-emission control signal EM.

Further, the fifth thin-film transistor T5 may be connected to one electrode P4 of the storage capacitor Cst. That is, the fifth thin-film transistor T5 may be configured such that one of its first and second electrodes is connected to the node P4, the other is connected to a first initialization voltage line Vinit1, and its gate electrode is connected, for example, through a node P9, to a line to which an (n−4)-th second scan signal S2($n-4$) is applied.

Further, the sixth thin-film transistor T6 may be connected to the anode electrode P8 of the OLED. That is, the sixth thin-film transistor T6 may be configured such that one of its first and second electrodes is connected to the node P8, the other is connected to a second initialization voltage line Vini2, and its gate electrode is connected to a line to which the (n−4)-th second scan signal S2($n-4$) is applied.

The compensation circuit may be configured for sampling the gate-source voltage Vgs in order to compensate for change in a threshold voltage of the driving transistor Tdr and may be configured to include the first to sixth thin-film transistors T1 to T6 and the storage capacitor Cst.

The driving transistor Tdr may control current flowing through the light-emitting diode OLED based on the data signal Vdata. In this regard, luminance of the OLED may be adjusted based on a magnitude of the current. The third and fourth thin-film transistors T3 and T4 as light-emission control transistors may be connected to the driving transistor Tdr and the light-emitting diode OLED to control light emission of the OLED.

Specifically, in response to the light-emission control signal EM supplied from a light-emission control line, the third and fourth thin-film transistors T3 and T4 as the light-emission control transistors may be turned on, such that the current flowing through the driving transistor Tdr may be transmitted to the OLED so that the OLED may emit light. When the third and fourth thin-film transistors T3 and T4 are turned off, the current flowing through the driving transistor Tdr may not be transmitted to the OLED, and thus the OLED may not emit light.

As described above, luminance of the display device may be determined based on a magnitude of current supplied from the driving transistor Tdr and a time duration for which the light-emission control transistors T3 and T4 are turned on.

Figure 15:
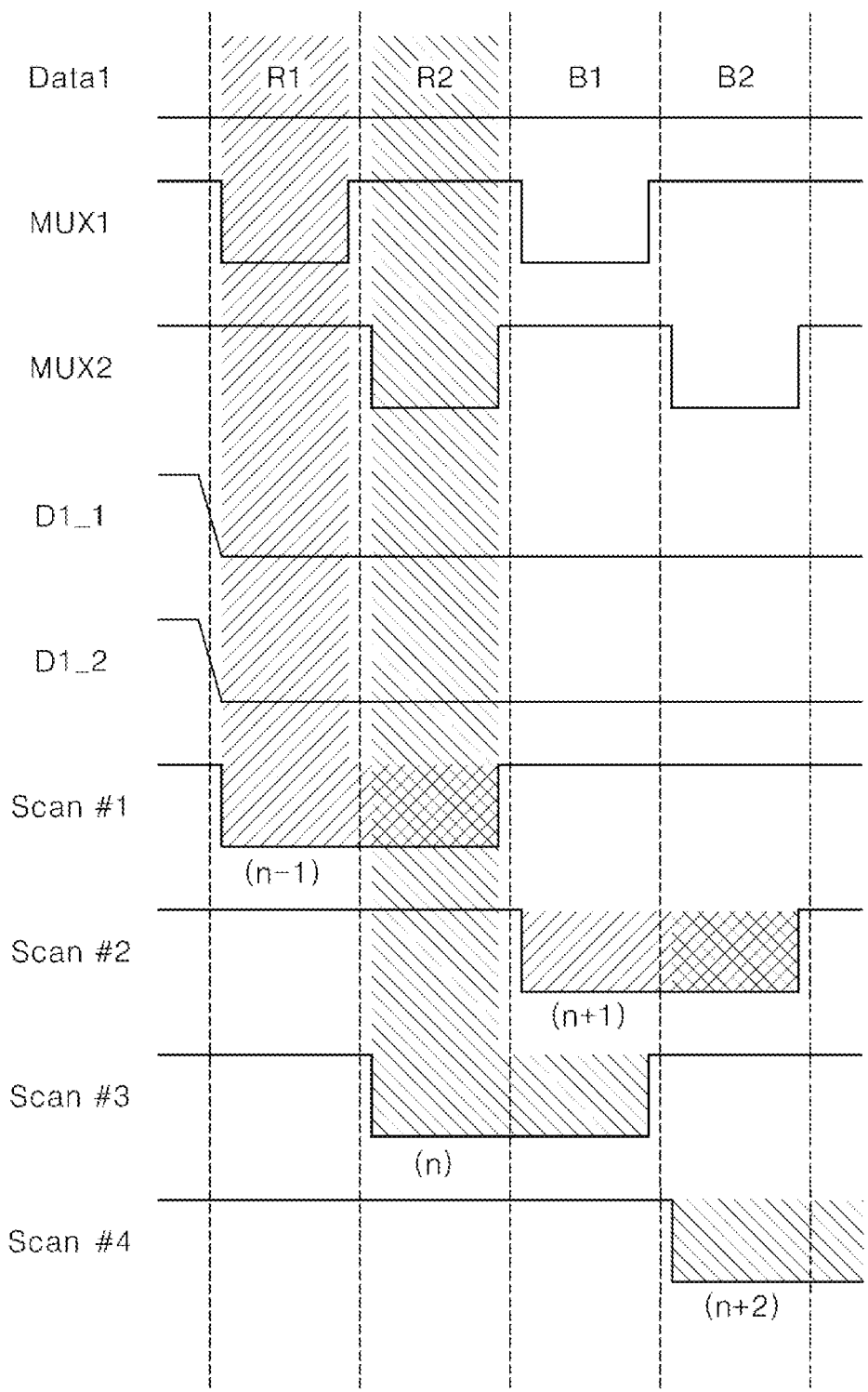
FIG. 15 is a diagram showing an interlaced scheme operation timing diagram of a third panel area according to an example embodiment of the present disclosure.

FIG. 15 is a diagram showing an interlaced scheme operation timing diagram of a third panel area according to an example embodiment of the present disclosure.

As illustrated in FIGS. 12 to 15, the third panel area 130 according to an example embodiment of the present disclosure may operate in an interlaced scheme. In this example case, one frame may be divided into a first half frame and a second half frame. For the first half frame, sub-pixels R1 and R2 disposed in an odd-numbered row may operate. For the second half frame, sub-pixels B1 and B2 disposed in an even-numbered row operate.

That is, the third panel area 130 may activate an odd-numbered rows for the first half frame of a single frame and may activate an even-numbered rows for the second half frame of the single frame.

For example, for the first half frame, the first multiplexer MUX1 (e.g., the first multiplexer switch T-MX1) may be turned on based on a low signal, and the second multiplexer MUX2 (e.g., the second multiplexer switch T-MX2) may be turned off based on a high signal. A low signal may be applied to both the data line D1_1 of one side (Left) and the data line D1_2 of the other side (Right). In this regard, an (n−1)-th first scan signal Scan #1 as a low signal may be applied to a scan line for two horizontal periods (2H). Accordingly, the first scan switch T-Sc1 may be turned on, and thus, a low signal from the data line D1_1 of one side (Left) may be applied to a first red sub sub-pixel R1 disposed in an odd-numbered first row. Accordingly, the first red sub sub-pixel R1 disposed in the odd-numbered first row may operate to emit light.

Thereafter, the first multiplexer MUX1 (e.g., the first multiplexer switch T-MX1) may be turned off based on a high signal, and the second multiplexer MUX2 (e.g., the second multiplexer switch T-MX2) may be turned on based on a low signal. A low signal may be applied to both the data line D1_1 of one side (Left) and the data line D1_2 of the other side (Right). In this regard, an n-th third scan signal Scan #3 as a low signal may be applied to the scan line for two horizontal periods (2H). Accordingly, the third scan switch T-Sc3 may be turned on, and thus, a low signal from the data line D1_2 of the other side (Right) may be applied to a second red sub-pixel R2 disposed in an odd-numbered third row. Accordingly, the second red sub sub-pixel R2 disposed in the odd-numbered third row may operate to emit light.

In this regard, the (n−1)-th first scan signal applied to the first scan line Scan #1 may have a low level for first two horizontal periods (2H). When a signal applied to the second multiplexer MUX2 is switched from a high signal to a low signal, the n-th third scan signal applied to the third scan line Scan #3 may be at a low level state for two horizontal periods (2H). That is, when an operation of the first red sub-pixel R1 is switched to an operation of the second red sub-pixel R2, a low level of the (n−1)-th first scan signal applied to the first scan line Scan #1 and a low level of the n-th third scan signal applied to the third scan line Scan #3 overlap each other for one horizontal period (1H). Therefore, when an operation of the first red sub-pixel R1 is switched to an operation of the second red sub sub-pixel R2, flicker phenomenon may not occur.

In one example, for the second half frame (not illustrated), the first multiplexer MUX1 (e.g., the first multiplexer switch T-MX1) may be turned on based on a low signal, and the second multiplexer MUX2 (e.g., the second multiplexer switch T-MX2) may be turned off based on a high signal. A low signal may be applied to both the data line D1_1 of one side (Left) and the data line D1_2 of the other side (Right). In this regard, a (n+1)-th second scan signal Scan #2 as a low signal may be applied to the scan line for two horizontal periods (2H). Accordingly, the second scan switch T-Sc2 is turned on, and thus, a low signal from the data line D1_1 of one side (Left) may be applied to a first blue sub-pixel B1 disposed in an even-numbered second row. Accordingly, the first blue sub sub-pixel B1 disposed in the even-numbered second row may operate to emit light.

Thereafter, the first multiplexer MUX1 (e.g., the first multiplexer switch T-MX1) may be turned off based on a high signal, and the second multiplexer MUX2 (e.g., the second multiplexer switch T-MX2) may be turned on based on a low signal. A low signal may be applied to both the data line D1_1 of one side (Left) and the data line D1_2 of the other side (Right). In this regard, an (n+2)-th fourth scan signal Scan #4 as a low signal may be applied to the scan line for two horizontal periods (2H). Accordingly, the fourth scan switch T-Sc4 may be turned on, and thus, a low signal from the data line D1_2 of the other side (Right) may be applied to a second blue sub-pixel B2 disposed in an even-numbered fourth row. Accordingly, the second blue sub sub-pixel B2 disposed in the even-numbered fourth row may operate to emit light.

In this regard, the (n+1)-th second scan signal applied to the second scan line Scan #2 may be at a low level state for two horizontal periods (2H). When a signal applied to the second multiplexer MUX2 is switched from a high signal to a low signal, the (n+2)-th fourth scan signal applied to the fourth scan line Scan #4 may be at a low level state for two horizontal periods (2H). That is, when an operation of the first blue sub-pixel B1 is switched to an operation of the second blue sub-pixel B2, a low level of the (n+1)-th second scan signal applied to the second scan line Scan #2 and a low level of the (n+2)-th fourth scan signal applied to the fourth scan line Scan #4 may overlap each other for a one horizontal period (1H). Therefore, when an operation of the first blue sub-pixel B1 is switched to an operation of the second blue sub-pixel B2, the flicker phenomenon may not occur. Therefore, in FIG. 15, "Data1" indicates the level of the data voltage applied to each sub-pixel (R1, R2, B1, B2).

As described above, in the third panel area 130 according to an example embodiment of the present disclosure, when the third panel area 130 operates in the interlaced scheme, the flicker may not occur when an operation of one sub-pixel is switched to an operation of another sub-pixel.

Figure 16:
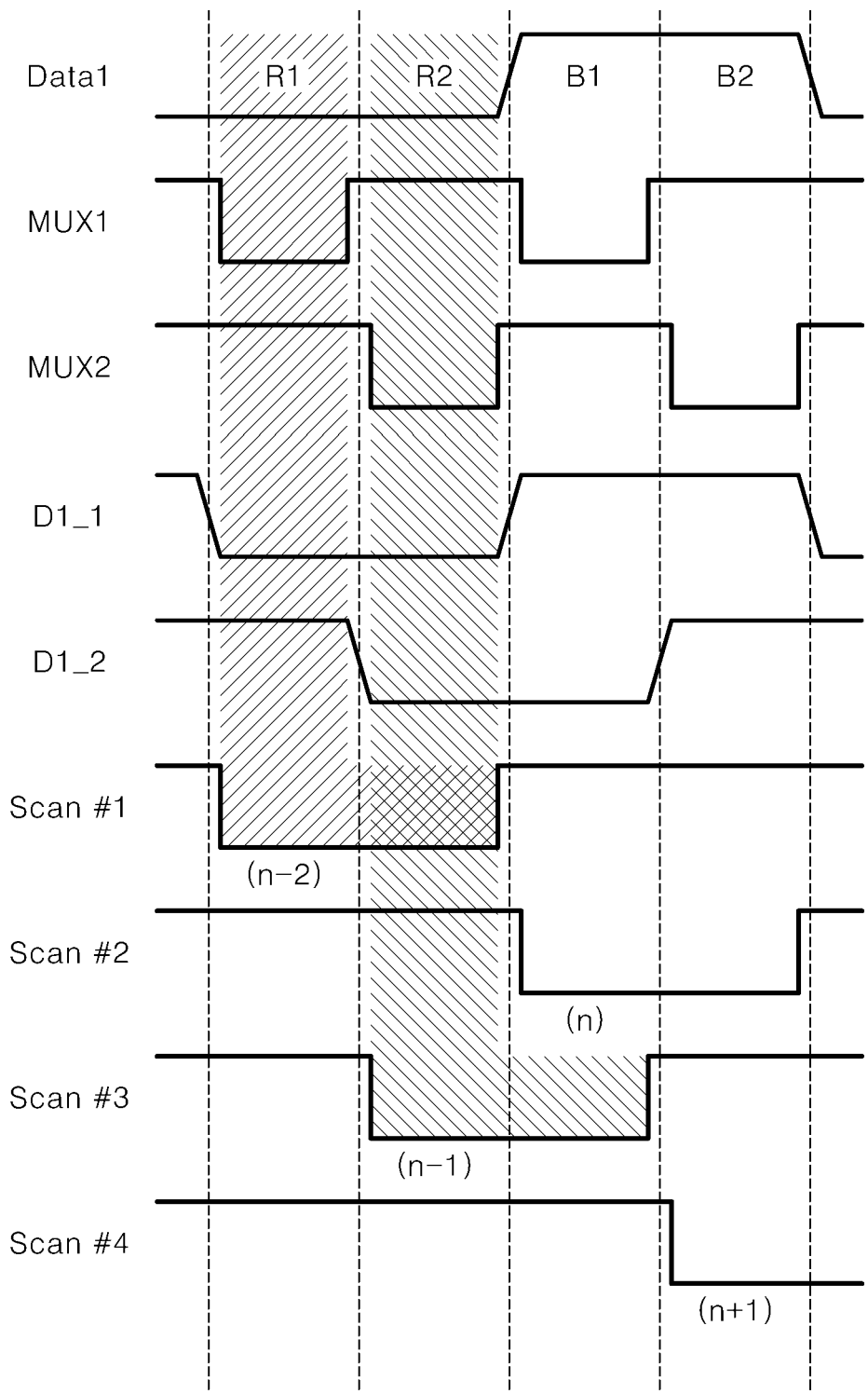
FIG. 16 is a diagram showing a progressive scheme operation timing diagram of a third panel area according to an example embodiment of the present disclosure.

FIG. 16 is a diagram showing a progressive scheme operation timing diagram of a third panel area according to an example embodiment of the present disclosure.

As illustrated in FIG. 12 to FIG. 14, and FIG. 16, when the third panel area 130 according to an example embodiment of the present disclosure operates in a progressive scheme, for one frame or for one half (½) frame, first, the first red sub-pixel R1 of the red sub-pixel R may operate based on the first scan signal applied to the first scan line Scan #1, second, the second red sub-pixel R2 of the red sub-pixel R may operate based on the third scan signal applied to the third scan line Scan #3, third, the first blue sub-pixel B1 of the third sub-pixel B may operate based on the second scan signal applied to the second scan line Scan #2, fourth, the second blue sub-pixel B2 of the blue sub-pixel B may operate based on the fourth scan signal applied to the fourth scan line Scan #4.

That is, when the third panel area 130 according to an example embodiment of the present disclosure operates in a progressive scheme, for one frame or for one half (½) frame, a data signal may be applied to a plurality of sub-pixels on a 4 row basis (or 4 scan lines basis). First, a data signal may be applied to pixels of a first row (R1). Next, a data signal may be applied to pixels of a third row (R2). Then, a data signal may be applied to pixels of a second row (B1). Then, a data signal may be applied to pixels of a fourth row (B2).

For example, for the first half (½ frame), the first multiplexer MUX1 may be turned on based on a low signal, and the second multiplexer MUX2 may be turned off based on a high signal. A low signal may be applied to the data line D1_1 of one side (Left), and a high signal may be applied to the data line D1_2 of the other side (Right). In this regard, an (n−2)-th first scan signal Scan #1 as a low signal may be applied to the scan line for two horizontal periods (2H). Accordingly, the first scan switch T-Sc1 may be turned on, and thus, a low signal from the data line D1_1 of one side (Left) may be applied to the first red sub-pixel R1 of the red sub-pixel R for two horizontal periods (2H). Accordingly, the first red sub-pixel R1 of the red sub-pixel R connected to the first scan line may operate to emit light.

Thereafter, the first multiplexer MUX1 may be turned off based on a high signal, and the second multiplexer MUX2 may be turned on based on a low signal. A low signal may be applied to both the data line D1_1 of one side (Left) and the data line D1_2 of the other side (Right). In this regard, an (n−1)-th third scan signal Scan #3 as a low signal may be applied to the scan line for two horizontal periods (2H). Accordingly, the third scan switch T-Sc3 may be turned on, and thus, a low signal from the data line D1_2 of the other side (Right) may be applied to the second sub sub-pixel R2 of the first sub-pixel R for two horizontal periods (2H). Accordingly, the second sub sub-pixel R2 of the first sub-pixel R connected to the third scan line may operate to emit light.

For the second half (½ frame), the first multiplexer MUX1 may be turned on based on a low signal, and the second multiplexer MUX2 may be turned off based on a high signal. A high signal may be applied to the data line D1_1 of one side (Left), and a low signal may be applied to the data line D1_2 of the other side (Right). In this regard, an n-th second scan signal Scan #2 as a low signal may be applied to the scan line for two horizontal periods (2H). Accordingly, the second scan switch T-Sc2 may be turned on, and thus, a high signal from data line D1_1 of one side (Left) may be applied to the first blue sub-pixel B1 of the blue pixel B for two horizontal periods (2H). Accordingly, the first blue sub-pixel B1 of the blue pixel B connected to the second scan line may operate to emit light.

Thereafter, the first multiplexer MUX1 may be turned off based on a high signal, and the second multiplexer MUX2 may be turned on based on a low signal. A high signal may be applied to both the data line D1_1 of one side (Left) and the data line D1_2 of the other side (Right). In this regard, an (n+1)-th fourth scan signal Scan #4 as a low signal may be applied to the scan line during two horizontal periods (2H). Accordingly, the fourth scan switch T-Sc4 may be turned on, and thus, a high signal from the data line D1_2 of the other side (Right) may be applied to the second blue sub-pixel B2 of the blue sub-pixel B for two horizontal periods (2H). Accordingly, the second blue sub-pixel B2 of the blue sub-pixel B connected to the fourth scan line may operate to emit light. Therefore, in FIG. 16, "Data1" indicates the level of the data voltage applied to each sub-pixel (R1, R2, B1, B2).

In this regard, the (n−2)-th first scan signal applied to the first scan line Scan #1 may be at low level and for two horizontal periods (2H). When a signal applied to the second multiplexer MUX2 is switched from a high signal to a low signal, the (n−1)-th third scan signal applied to the third scan line Scan #3 may be at a low level state for two horizontal periods (2H). That is, when an operation of the first red sub-pixel R1 of the red sub-pixel R is switched to an operation of the second red sub-pixel R2 of the red sub-pixel R, a low level of the (n−2)-th first scan signal applied to the first scan line Scan #1 and a low level of the (n−1)-th third scan signal applied to the third scan line Scan #3 may overlap each other for a one horizontal period (1H) of the two horizontal periods (2H). Therefore, when an operation of the first sub sub-pixel R1 of the first sub-pixel R is switched to an operation of the second sub sub-pixel R2 of the first sub-pixel R, the flicker phenomenon may not occur.

Further, when an operation of the first blue sub-pixel B1 of the blue sub-pixel B is switched to an operation of the second blue sub-pixel B2 of the blue sub-pixel B, a low level of the n-th second scan signal applied to the second scan line Scan #2 and a low level of the (n+1)-th fourth scan signal applied to the fourth scan line Scan #4 may overlap each other for a one horizontal period (1H) of the two horizontal periods (2H). Therefore, when an operation of the first blue sub-pixel B1 of the blue sub-pixel B is switched to an operation of the second blue sub-pixel B2 of the blue sub-pixel B, the flicker phenomenon may not occur.

As described above, in the third panel area 130 according to an example embodiment of the present disclosure, when the third panel area 130 operates in a progressive scheme, the flicker may not occur when an operation of one sub-pixel is switched to an operation of another sub-pixel.

As described above, according to an example embodiment of the present disclosure, a display panel may include a plurality of sub-pixels arranged in rows and columns; a plurality of scan lines arranged such that one scan line is disposed in each of the rows of the plurality of sub-pixels; a plurality of data lines arranged such that two data lines are disposed in each of the columns of the plurality of sub-pixels; a first multiplexer MUX1 configured to select a data line D1_1 at one side among the two data lines disposed in each column; and a second multiplexer MUX2 configured to select a data line D1_2 at the other side among the two data lines disposed in each column.

Further, according to an example embodiment of the present disclosure, a display device 100 may include a display panel 20 including: a plurality of sub-pixels arranged in rows and columns; a plurality of scan lines arranged such that one scan line is disposed in each of the rows of the plurality of sub-pixels; a plurality of data lines arranged such that two data lines are disposed in each of the columns of the plurality of sub-pixels; a first multiplexer MUX1 configured to select a data line D1_1 at one side among the two data lines disposed in each column; a second multiplexer MUX2 configured to select a data line D1_2 at the other side among the two data lines disposed in each column; each of first and second scan switches for switching the scan line disposed in a respective row (a row corresponding to the first and/or second scan switches) to be connected to the data line D1_1 at the one side disposed in a respective column (a column corresponding to the first and/or second scan switches); and each of third and fourth scan switches for switching the scan line disposed in a respective row (a row corresponding to the third and/or fourth scan switches) to be connected to the data line D1_2 at the other side disposed in a respective column (a column corresponding to the third and/or fourth scan switches); a scan driver for applying a scan signal to the plurality of scan lines; a data driver for applying a data signal to the plurality of data lines; a power supply for providing a high-potential voltage, a low-potential voltage, and an initialization voltage to each of the sub-pixels; and a timing controller for controlling the scan driver and the data driver, wherein pairs of the first and second scan switches and pairs of the third and fourth scan switches are alternatively arranged with each other in the column direction of the sub-pixels and in a zig-zag manner.

As described above, according to example embodiments of the present disclosure, when the display panel operates in the low-speed mode (30 Hz), the device may operate in an interlaced scheme in which a plurality of sub-pixels are grouped into an odd-numbered frame group and an even-numbered frame group, and a data voltage may be applied to sub-pixels corresponding to the odd-numbered frame group for a first half frame, and a data voltage may be applied to sub-pixels corresponding to the even-numbered frame group for a second half frame; and when the device operates in the high-speed mode (60 to 120 Hz), the device may operate in a progressive scheme in which the device may operate on a 4-scan line basis such that the data voltage may be input to the first to the fourth scan lines in an order of the first scan line, the third scan line, the second scan line, and the fourth scan line.

The following examples pertain to further embodiments:

Example 1: A display panel comprising: a first panel area having a first front face and a first rear face; a second panel area having a second front face and a second rear face, wherein when the display panel is in a folded state at a boundary between the first and second panel areas, the second panel area confront to the first panel area such that the second rear face faces the first rear face; a third panel area having a third front face and a third rear face, wherein when the display panel is in the folded state at a boundary between the second and third panel areas, the third panel area confront to the second panel area such that the third front face faces the second front face; a first hinge coupling portion for coupling one end of the first panel area and the opposite end of the second panel area to each other in a hinge coupling manner; and a second hinge coupling portion for coupling one end of the second panel area and the opposite end of the third panel area to each other in the hinge coupling manner, wherein the first panel area, the second panel area, and the third panel area are continuously arranged and are integrally formed with each other.

Example 2: The display panel of Example 1, further comprising an outer body extending from one end of the third panel area, and having a width equal to a width of the third panel area, and having a thickness and a vertical dimension greater than a thickness and a vertical dimension of the third panel area; and a transparent cover for covering the first front face of the first panel area.

Example 3: The display panel of Example 2, wherein the outer body has a shape formed so as to face and surround the one end of the first panel area, the opposite end of the second panel area, and the first hinge coupling portion when all of the first panel area, the second panel area, and the third panel area are in the folded state relative to each other.

Example 4: The display panel of Example 2 or 3, wherein a cover-receiving hole is formed in the outer body, wherein the transparent cover is inserted into the cover-receiving hole, wherein an accommodation space for accommodating the transparent cover inserted into the cover-receiving hole is formed inside the outer body.

Example 5: The display panel of Example 4, wherein a moving holder connected to the transparent cover so as to move the transparent cover and a moving rail for providing a movement path for the moving holder are formed at a lower end of the third panel area integrally formed with the outer body.

Example 6: The display panel of Example 5, wherein when the moving holder moves from one side to the other side along the moving rail, the transparent cover is inserted into the cover-receiving hole and is accommodated in the accommodation space.

Example 7: The display panel of Example 5 or 6, wherein when the moving holder moves from the other side to one side along the moving rail, the transparent cover protrudes outwardly from the cover-receiving hole so as to cover the third front face of the third panel area.

Example 8: The display panel of any of Examples 2 to 7, wherein the outer body has a storage hole defined therein, wherein a touch pen is inserted into and stored in the storage hole.

Example 9: The display panel of any of Examples 2 to 8, wherein the outer body further includes: a camera for photographing an external object to obtain an image thereof; a speaker for outputting sound; a flash unit for outputting light; and an illuminometer for detecting ambient brightness.

Example 10: The display panel of Example 9, further comprising: a printed circuit board (PCB) disposed inside the outer body and electrically connected to the camera, the speaker, the flash unit, and the illuminometer.

Example 11: The display panel of Example 10, further comprising: a flexible printed circuit board (FPCB) for electrically connecting the printed circuit board (PCB) to the third panel area or a third display unit of the third panel area.

Example 12: The display panel of any of Examples 1 to 11, wherein at least one contact hole is formed in a printed circuit board (PCB), wherein the printed circuit board (PCB) is electrically connected to a flexible printed circuit board (FPCB) via the at least one contact hole.

Example 13: A display device comprising: a display panel including: a first panel area having a first display unit as a first front face thereof; a second panel area having a second display unit as a second front face thereof, and corresponding to the first panel area; a third panel area having a third display unit as a third front face thereof, and corresponding to the second panel area; a first hinge coupling portion for coupling the first panel area and the second panel area to each other in a hinge coupling manner; and a second hinge coupling portion for coupling the second panel area and the third panel area to each other in the hinge coupling manner, wherein each of the first panel area, the second panel area, and the third panel area includes an active area and a non-active area, wherein the first display unit, the second display unit, and the third display unit are continuously arranged and integrally formed with each other, wherein each of the first display unit, the second display unit, and the third display unit includes a plurality of scan lines and a plurality of data lines arranged to intersect each other, and a plurality of pixels respectively disposed at intersections therebetween, wherein each pixel includes an organic light emitting diode, wherein each the non-active area includes: a scan driver for applying a scan signal to the plurality of scan lines; a data driver for applying a data signal to the plurality of data lines; a power supply for providing a high-potential voltage, a low-potential voltage, and an initialization voltage to each pixel; and a timing controller for controlling the scan driver and the data driver.

Example 14: The display device of Example 13, wherein the pixel includes a plurality of sub-pixels arranged in rows and columns, wherein one scan line is disposed in each of the rows of the plurality of sub-pixels, and two data lines are disposed in each of the columns of the plurality of sub-pixels; wherein the display panel further includes: a first multiplexer configured to select a data line at one side among the two data lines disposed in each column; a second multiplexer configured to select a data line at the other side among the two data lines disposed in each column; each of first and second scan switches for switching the scan line disposed in each row to be connected to the data line at the one side disposed in each column; and each of third and fourth scan switches for switching the scan line disposed in each row to be connected to the data line at the other side disposed in each column.

Example 15: The display device of Example 14, wherein the first and second scan switches are respectively disposed in two sub-pixels arranged consecutively in a column direction along the data line at one side among the plurality of sub-pixels, wherein the third and fourth scan switches are respectively disposed in two sub-pixels arranged consecutively in the column direction along the data line at the other side among the plurality of sub-pixels.

Example 16: The display device of Example 14 or 15, wherein the first multiplexer includes a first multiplexer switch configured such that a first electrode thereof is connected to the data line at one side, a gate electrode thereof is connected to a first multiplexer line for applying a first selection signal, and a second electrode thereof is connected to first power.

Example 17: The display device of Example 16, wherein the first multiplexer switch is turned on based on the first selection signal applied to the gate electrode through the first multiplexer line, such that the first power applied thereto through the second electrode is applied to the data line at the one side through the first electrode.

Example 18: The display device of any of Examples 14 to 17, wherein the second multiplexer includes a second multiplexer switch having a first electrode connected to the data line of the other side, a gate electrode connected to a second multiplexer line for applying a second selection signal, and a second electrode connected to first power.

Example 19: The display device of Example 18, wherein the second multiplexer switch is turned on based on the second selection signal applied to the gate electrode through the second multiplexer line, such that the first power applied through the second electrode is applied to the data line at the other side through the first electrode.

It should be understood that the example embodiments as described above are illustrative and non-limiting in all respects. The scope of protection of the present disclosure should be interpreted by the claims.

It will be apparent to those skilled in the art that various modifications and variations can be made in the present disclosure without departing from the technical idea or scope of the disclosures. Thus, it is intended that embodiments of the present disclosure cover the modifications and variations of the disclosure provided they come within the scope of the appended claims and their equivalents.

What is claimed is:

1. A display device, comprising:
   a display panel, comprising:
      a first panel area having a first front face and a first rear face;
      a second panel area having a second front face and a second rear face, the second panel area being configured to overlap the first panel area with the second rear face facing the first rear face with the display panel in a folded state at a boundary between the first and second panel areas;
      a third panel area having a third front face and a third rear face, the third panel area being configured to overlap the second panel area with the third front face facing the second front face with the display panel in a folded state at a boundary between the second and third panel areas;
      a first hinge coupling for coupling a first end of the first panel area and a first end of the second panel area to each other in a hinge coupling manner; and
      a second hinge coupling for coupling a second end of the second panel area and a first end of the third panel area to each other in the hinge coupling manner;
   a transparent cover covering the first front face of the first panel area;
   a moving holder connected to the transparent cover;
   a moving rail for providing a movement path for the moving holder; and
   an outer body extending from a second end of the third panel area,
   wherein the first panel area, the second panel area, and the third panel area are continuously arranged and are integrally formed with each other,
   wherein the outer body includes:
      a cover-receiving hole formed in the outer body; and
      an accommodation space inside the outer body for accommodating the transparent cover inserted into the cover-receiving hole, and
   wherein, with the moving holder moving from one side to the other side along the moving rail, the transparent cover is configured to be inserted into the cover-receiving hole and into the accommodation space of the outer body.

2. A display device of claim 1, wherein:
   the outer body has a width equal to a width of the third panel area and has a thickness and a vertical dimension greater than a thickness and a vertical dimension of the third panel area; and
   the transparent cover is connected to the outer body for covering the first front face of the first panel area with the display panel in fully folded in a Z-shape.

3. The display device of claim 2, wherein the outer body is configured to face and surround the first end of the first panel area, the first end of the second panel area, and the first hinge coupling with all of the first panel area, the second panel area, and the third panel area in the folded state relative to each other in the Z-shape.

4. The display device of claim 2, wherein
the transparent cover is configured to be inserted into or slid out of the cover-receiving hole.

5. The display device of claim 4, wherein:
the moving holder is connected to the transparent cover to move the transparent cover into or out of the cover-receiving hole; and
the moving holder and the moving rail are disposed at a lower end of the third panel area integrally formed with the outer body.

6. The display device of claim 1, wherein with the moving holder moving from the other side to the one side along the moving rail, the transparent cover is configured to protrude out from the cover-receiving hole so as to cover the third front face of the third panel area or the first front face of the first panel area.

7. The display device of claim 2, wherein the outer body has an integrated storage hole to accommodate a touch pen.

8. The display device of claim 2, wherein the outer body further includes:
a camera for photographing an external object to obtain an image thereof;
a speaker for outputting sound;
a flash for outputting light; and
an illuminometer for detecting ambient brightness.

9. The display device of claim 8, further comprising:
a printed circuit board (PCB) disposed inside the outer body and electrically connected to the camera, the speaker, the flash, and the illuminometer.

10. The display device of claim 9, further comprising:
a flexible printed circuit board (FPCB) for electrically connecting the printed circuit board (PCB) to the third panel area or a display of the third panel area.

11. The display device of claim 1, wherein the display panel is connected to a printed circuit board (PCB) via a flexible printed circuit board (FPCB), the printed circuit board (PCB) having at least one contact hole via which the printed circuit board (PCB) is electrically connected to the flexible printed circuit board (FPCB).

* * * * *